(12) United States Patent
Abe et al.

(10) Patent No.: US 8,243,498 B2
(45) Date of Patent: Aug. 14, 2012

(54) SEMICONDUCTOR INTEGRATED CIRCUIT

(75) Inventors: Keiko Abe, Yokohama (JP); Shinobu Fujita, Inagi (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 12/884,452

(22) Filed: Sep. 17, 2010

(65) Prior Publication Data

US 2011/0216573 A1    Sep. 8, 2011

(30) Foreign Application Priority Data

Mar. 5, 2010   (JP) .................... 2010-049912

(51) Int. Cl.
*G11C 11/00*   (2006.01)
(52) U.S. Cl. .......................................... 365/148
(58) Field of Classification Search .................. 365/148, 365/158, 227, 229
See application file for complete search history.

(56) References Cited

U.S. PATENT DOCUMENTS

| | | | | |
|---|---|---|---|---|
| 6,111,780 | A * | 8/2000 | Bertin | 365/154 |
| 6,847,543 | B2 * | 1/2005 | Toyoda et al. | 365/154 |
| 6,944,050 | B2 | 9/2005 | Kang et al. | 365/158 |
| 7,336,525 | B2 | 2/2008 | Fujita et al. | 365/154 |
| 2006/0083047 | A1 | 4/2006 | Fujita et al. | 365/145 |
| 2007/0187785 | A1 * | 8/2007 | Hung et al. | 257/421 |

FOREIGN PATENT DOCUMENTS

| | | |
|---|---|---|
| JP | 60-224195 A | 11/1985 |
| JP | 2004-103174 | 4/2004 |
| JP | 2007-519144 A | 7/2007 |
| WO | WO03/105156 | 12/2003 |

OTHER PUBLICATIONS

Yamamoto, et al., "Nonvolatile Static Random Access Memory Using Magnetic Tunnel Junctions with Current-Induced Magnetization Switching Architecture", Japanese Journal of Applied Physics, 2009, 48, pp. 043001-1 through 043001-7.
Japanese Office Action dated Jan. 31, 2012 from JP 2010-049912 (with English translation).
Yamamoto, et al.; "Nonvolatile Static Random Access Memory Using Magnetic Tunnel Junctions with Current-Induced Magnetization Switching Architecture"; Japanese Journal of Applied Physics; 48, 2009, 043001, 7 pages.

* cited by examiner

*Primary Examiner* — Hoai V Ho
*Assistant Examiner* — Pablo Huerta
(74) *Attorney, Agent, or Firm* — Ohlandt, Greeley, Ruggiero & Perle, L.L.P.

(57) ABSTRACT

According to one embodiment, a semiconductor integrated circuit includes first and second inverters, a first transistor which has a gate connected to a word line, a source connected to a first bit line, and a drain connected to an input terminal of the second inverter, a second transistor which has a gate connected to the word line, a source connected to a second bit line, and a drain connected to an input terminal of the first inverter, a first variable resistive element which has a first terminal connected to the drain of the first transistor, and a second terminal connected to an output terminal of the first inverter, and a second variable resistive element which has a first terminal connected to the drain of the second transistor, and a second terminal connected to an output terminal of the second inverter.

19 Claims, 16 Drawing Sheets

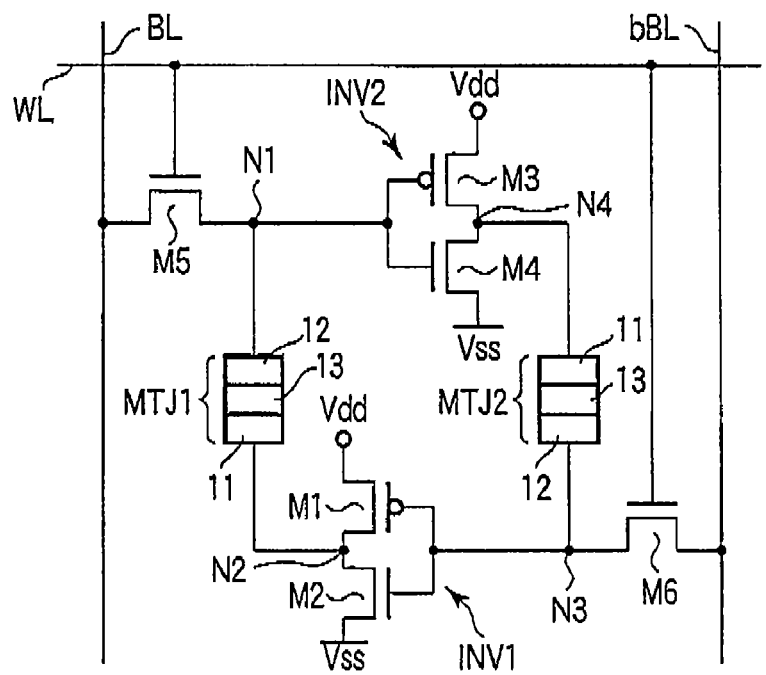
F I G. 13
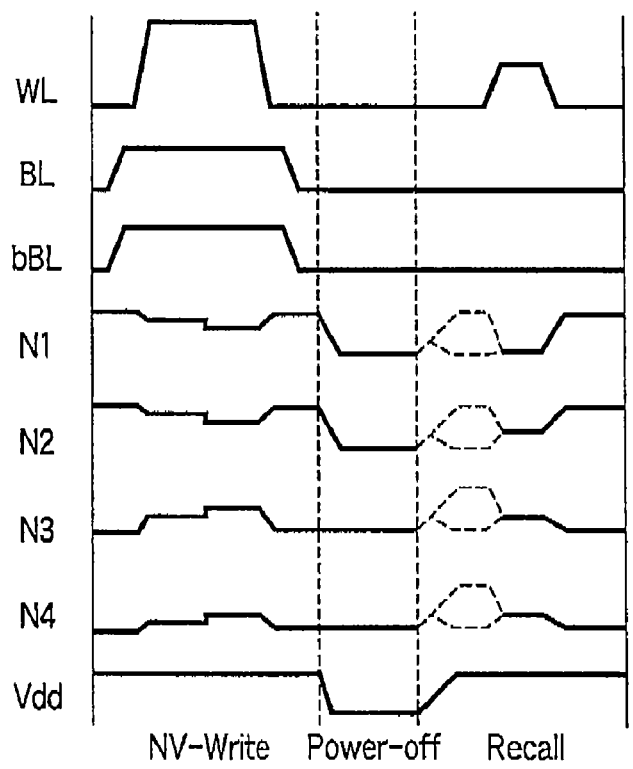
F I G. 15

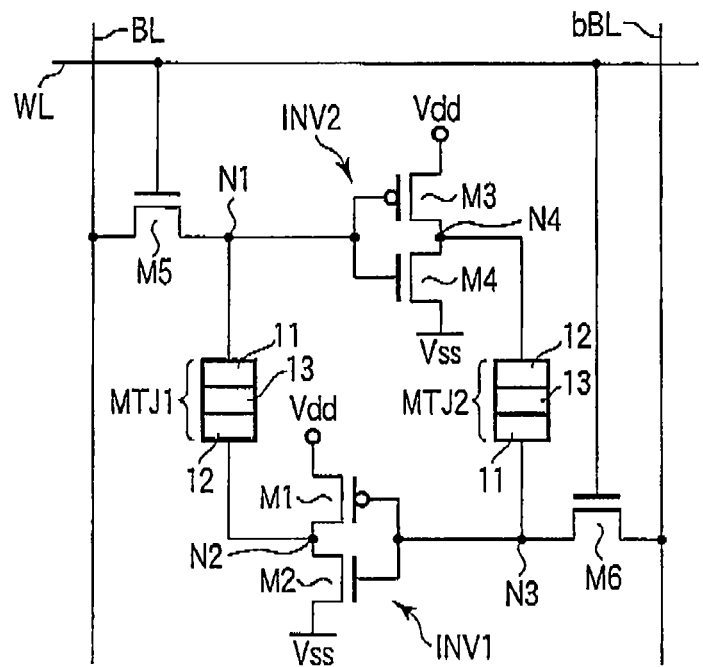
F I G. 17
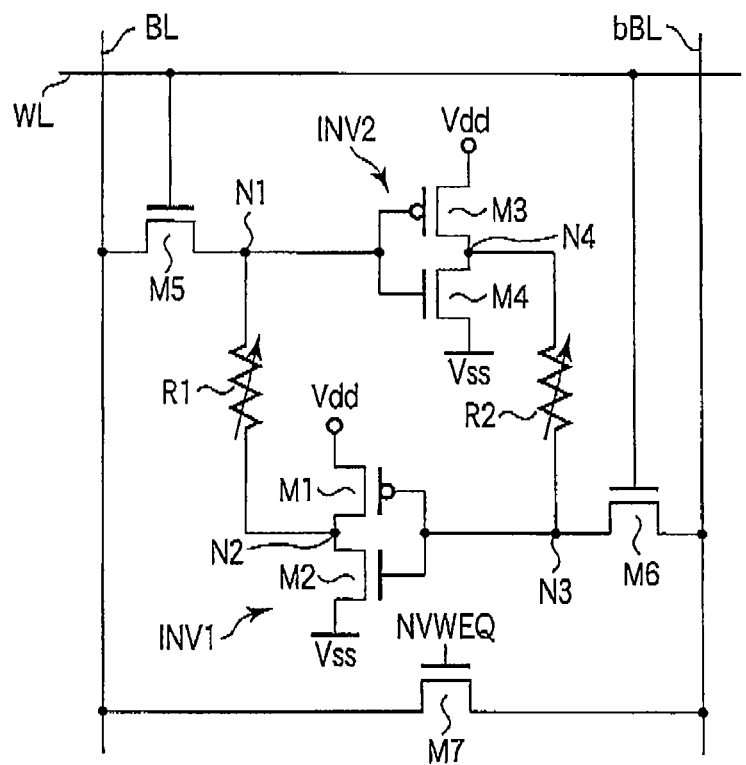
F I G. 18

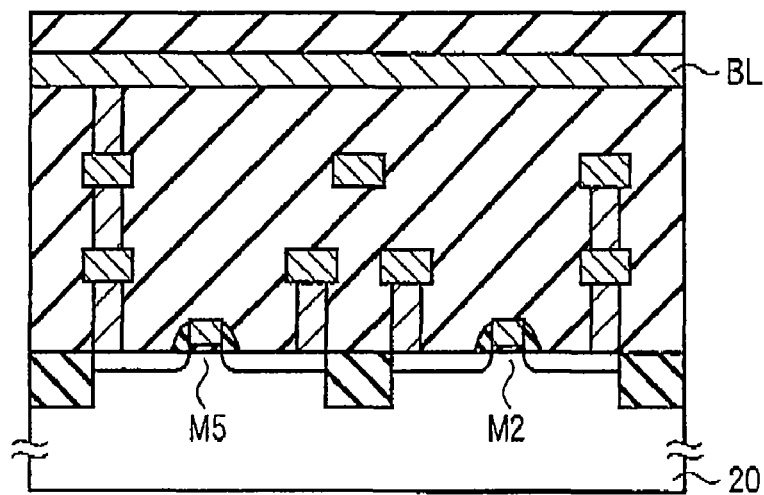
F I G. 22
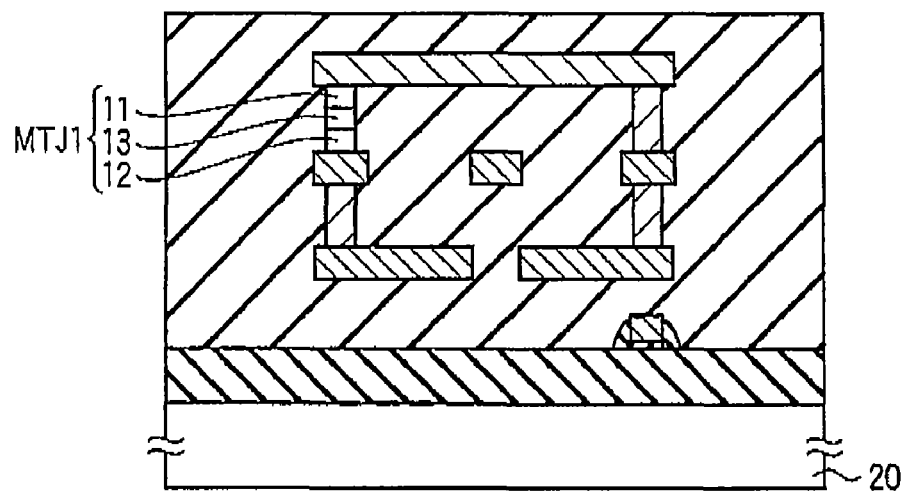
F I G. 23

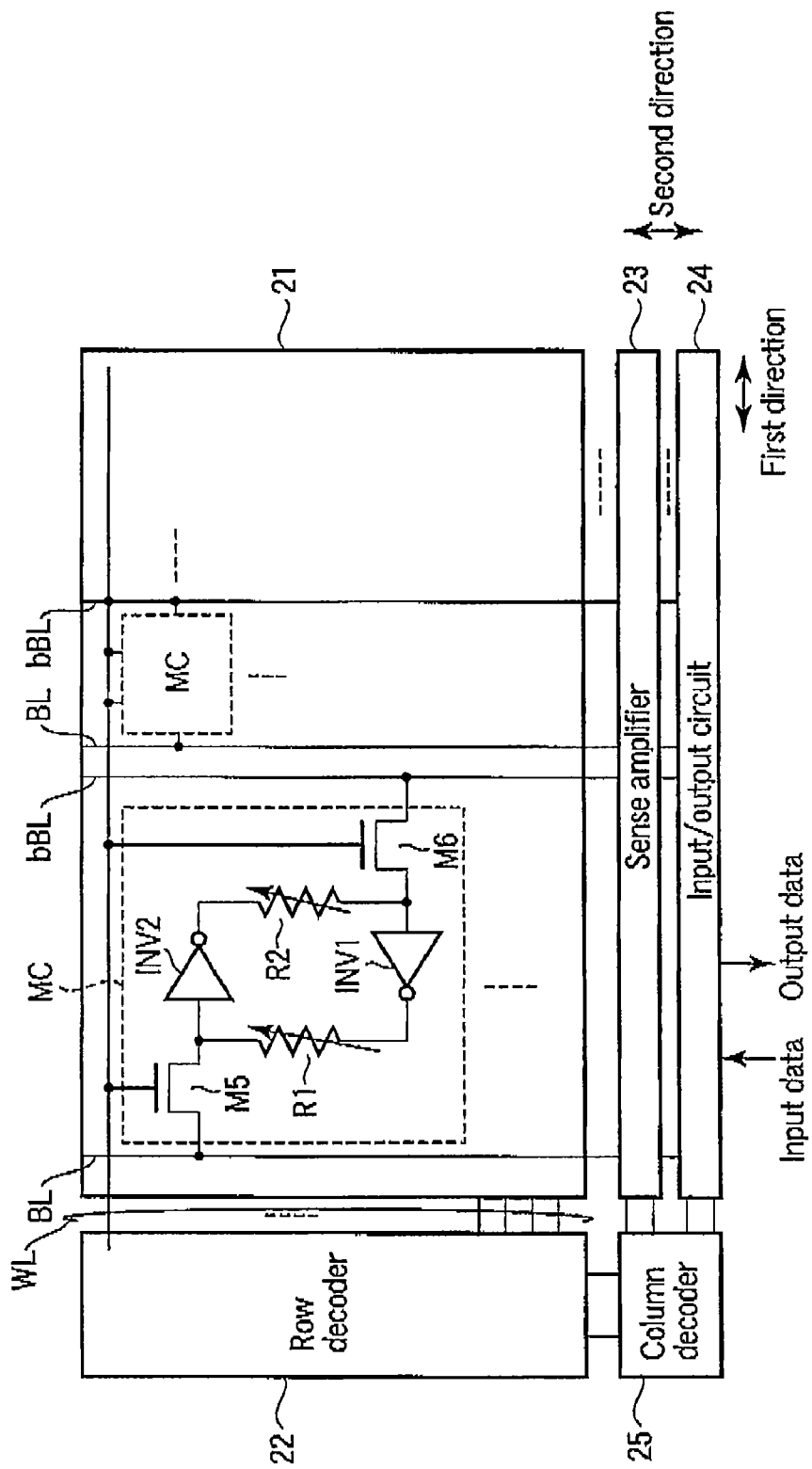
F I G. 26

US 8,243,498 B2

SEMICONDUCTOR INTEGRATED CIRCUIT

CROSS-REFERENCE TO RELATED APPLICATIONS

This application is based upon and claims the benefit of priority from Japanese Patent Application No. 2010-049912, filed Mar. 5, 2010; the entire contents of which are incorporated herein by reference.

FIELD

Embodiments described herein relate generally to a semiconductor integrated circuit.

BACKGROUND

Recently, an energy consumption reduction technique for a processor in a mobile device has become essential. Such a processor is equipped with a static random access memory (SRAM) as a cache memory in which data frequently used by the processor is stored. Since the SRAM is volatile, it is necessary to continuously apply a power supply voltage to the SRAM to maintain stored data. Therefore, in the SRAM, energy, although small, is wasted by a leakage current during standby, when there is no access from the processor.

As a way of reducing the leakage current and so reducing the energy consumption of the processor, a nonvolatile SRAM that can continue to hold data even during standby when power is not being supplied is expected.

A nonvolatile SRAM that is known at present is disclosed in Japanese Journal of Applied Physics 48 (2009) 043001 by Shuichiro Yamamoto and Satoshi Sugahara.

The nonvolatile SRAM reduces leakage current during standby by storing data in a spin-transfer magnetic tunnel junction (MTJ) element.

The MTJ element is a resistance-change nonvolatile memory element whose resistance varies according to a difference in a direction in which a write current is passed. The MTJ element has a feature that the data write time is short and the endurance is high among the nonvolatile memory elements.

As shown in FIG. 1 of Japanese Journal of Applied Physics 48 (2009) 043001 by Shuichiro Yamamoto and Satoshi Sugahara, a memory cell of the conventional nonvolatile SRAM (hereinafter referred to as a nonvolatile SRAM cell) is configured by connecting one end of an MTJ element to nodes of cross-coupled inverters and connecting the other end of the MTJ element to a control line.

In this case, a data holding node Q and an inverted data holding node/Q are connected to each other via the MTJ element and control line CTRL. Therefore, when the resistance of the MTJ element in a high-resistance state is less than the resistance of a turned-off transistor, a leakage current flows between the data holding node Q and the inverted data holding node/Q, and the energy consumption increases.

Further, in order to write data to the MTJ element, a control line is required. Therefore, the area of the nonvolatile SRAM cell becomes larger in comparison with that of a memory cell of a volatile SRAM and the number of interconnect layers increases.

BRIEF DESCRIPTION OF THE DRAWINGS

FIG. 13 shows a circuit of a first embodiment.
FIGS. 14 to 16 show an operation of the first embodiment.
FIG. 17 shows a circuit of a second embodiment.
FIG. 18 shows a circuit of a third embodiment.
FIG. 22 is a cross-sectional view along with XXII-XXII of FIG. 21.
FIG. 23 is a cross-sectional view along with of FIG. 21.
FIG. 26 shows a nonvolatile SRAM as an application example.

DETAILED DESCRIPTION

In general, according to one embodiment, a semiconductor integrated circuit includes first and second inverters, a first transistor which has a gate connected to a word line, a source connected to a first bit line, and a drain connected to an input terminal of the second inverter, a second transistor which has a gate connected to the word line, a source connected to a second bit line, and a drain connected to an input terminal of the first inverter, a first variable resistive element which has a first terminal connected to the drain of the first transistor, and a second terminal connected to an output terminal of the first inverter, and a second variable resistive element which has a first terminal connected to the drain of the second transistor, and a second terminal connected to an output terminal of the second inverter.

1. Basic Concept

The present disclosure proposes the technique for realizing a nonvolatile SRAM cell having substantially the same cell area as the cell area of a conventional volatile SRAM cell.

(1) Basic Circuit

Figure 1:
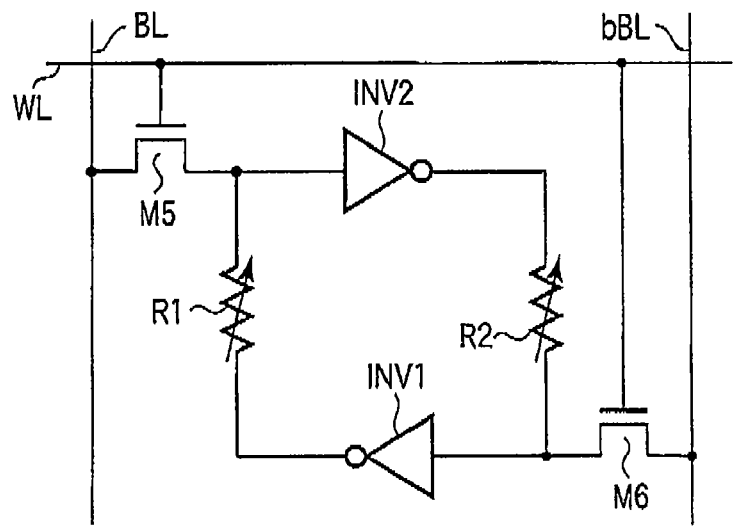
FIG. 1 shows a basic circuit of a nonvolatile SRAM cell.

FIG. 1 shows a basic circuit of a nonvolatile SRAM cell according to the present disclosure.

First and second inverters INV1, INV2 are cross-coupled.
First field-effect transistor (FET) M5 is a transfer transistor and has a gate connected to word line WL, a source connected to first bit line BL and a drain connected to the input terminal of second inverter INV2.

Second transistor (FET) M6 is also a transfer transistor and has a gate connected to word line WL, a source connected to second bit line bBL and a drain connected to the input terminal of first inverter INV1.

In order to provide a function of storing data as a nonvolatile memory to the SRAM cell, first and second variable resistive elements R1, R2 are additionally provided as elements of the SRAM cell. In this case, first and second variable resistive elements R1, R2 are arranged in the SRAM cell with the following connection relation without increasing the cell area.

A first terminal (one end) of first variable resistive element R1 is connected to the drain of first transistor M5 and a second terminal (the other end) thereof is connected to the output terminal of first inverter INV1. Further, a first terminal of second variable resistive element R2 is connected to the drain of second transistor M6 and a second terminal thereof is connected to the output terminal of second inverter INV2.

With the above configuration, a nonvolatile SRAM cell having a small cell area can be provided.

First and second variable resistive elements R1, R2 are each formed of an element whose resistance value can be varied according to a current or electric field, for example, a magnetoresistive element used in a magnetoresistive random access memory based on spin-transfer torque (STT-MRAM), a phase change element used in a phase change random access memory (PCRAM) or a resistance change element used in a resistive random access memory (ReRAM).

(2) Basic Operation

The nonvolatile SRAM cell of FIG. 1 is operated in three basic operation modes of reset/write/read are provided. Further, in write/read, a normal mode and nonvolatile mode are provided.

Figure 2:
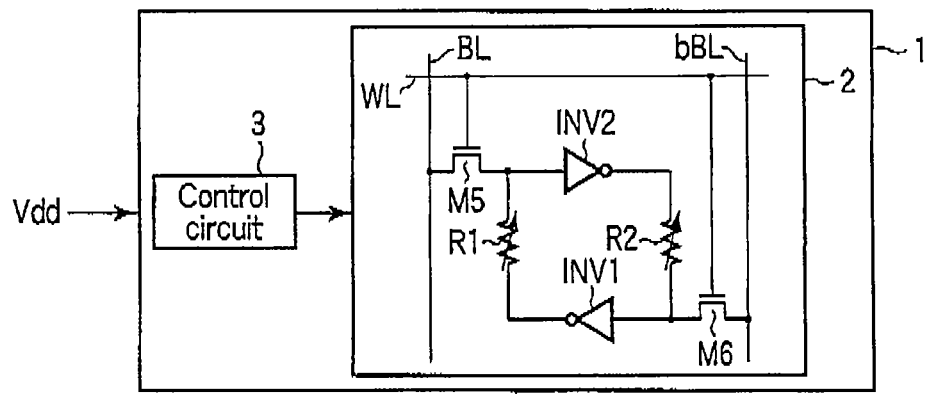
FIG. 2 shows a system having the nonvolatile SRAM cell.

For example, as shown in FIG. 2, the operation of nonvolatile SRAM cell 2 at the reset/write/read time is controlled by control circuit 3 in system (for example, processor) 1.

Table 1 indicates voltage levels of word line WL and first and second bit lines BL, bBL at the reset/write/read time.

TABLE 1

|  | Normal mode | | | Nonvolatile mode | |
| --- | --- | --- | --- | --- | --- |
|  | Reset | Normal write | Read | NV-write | Recall |
| WL | H | H | H | H | L |
| BL | L | H/L | DATA | H | L |
| bBL | L | L/H | bDATA | H | L |

A. Reset

Figure 3:
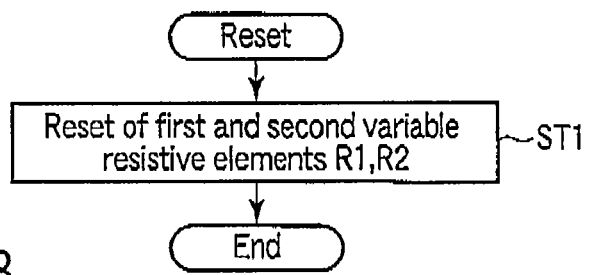
FIG. 3 is a flow chart showing a reset operation.

As shown in the flowchart of FIG. 3, for example, the reset operation is performed before the data write operation. Specifically, the states of first and second variable resistive elements R1, R2 in the nonvolatile SRAM cell are reset before data is written (step ST1).

Resetting the states of first and second variable resistive elements R1, R2 means that the resistance values of first and second variable resistive elements R1, R2 are set to the same value (low resistance value/high resistance value).

First, if power source voltage Vdd is applied to system 1 including nonvolatile SRAM cell 2 in FIG. 2, control circuit 3 becomes active. The resistance values of first and second variable resistive elements R1, R2 are set to the same value when control circuit 3 setting first and second bit lines BL, bBL to the same potential and turning on first and second transistors M5, M6.

Figure 4:
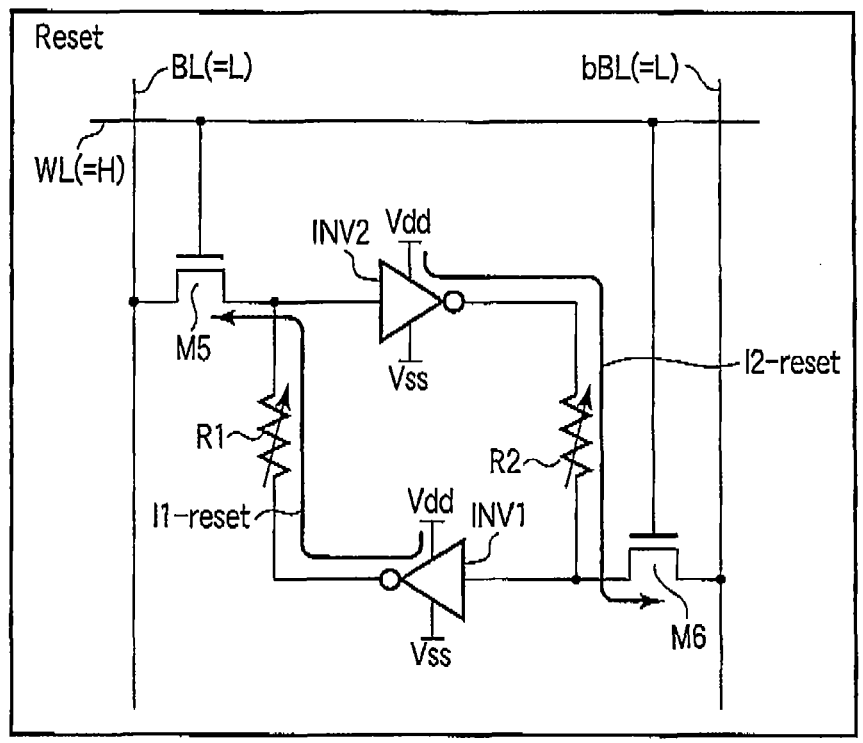
FIG. 4 shows an example of the reset operation.

A-1. First and Second Variable Resistive Elements R1, R2 are Set into the Same State:

For example, as shown in FIG. 4, first and second bit lines BL, bBL, are both set to "L" indicating the low potential. Further, word line WL is set to "H" indicating the high potential to turn on first and second transistors M5, M6.

At this time, reset current I1-reset that flows from first inverter INV1 to first bit line BL is passed through first variable resistive element R1 and reset current I2-reset that flows from second inverter INV2 to second bit line bBL is passed through second variable resistive element R2.

As a result, the resistance values of first and second variable resistive elements R1, R2 are set to the same state (low resistance state).

B. Write/Read

The write/read operation has a normal mode and nonvolatile mode.

B-1. Normal Mode:

The normal mode is a mode in which data is stored in the SRAM cell as a volatile memory. In the normal mode, the write/read operation is performed in the same operation as the conventional SRAM cell.

B-1-1. Write:

In FIG. 2, control circuit 3 stores volatile data in nonvolatile SRAM cell 2 by setting one of first and second bit lines BL, bBL to "H", setting the other bit line to "L" and setting word line WL to "H" according to values of write data items DATA, bDATA.

Figure 5:
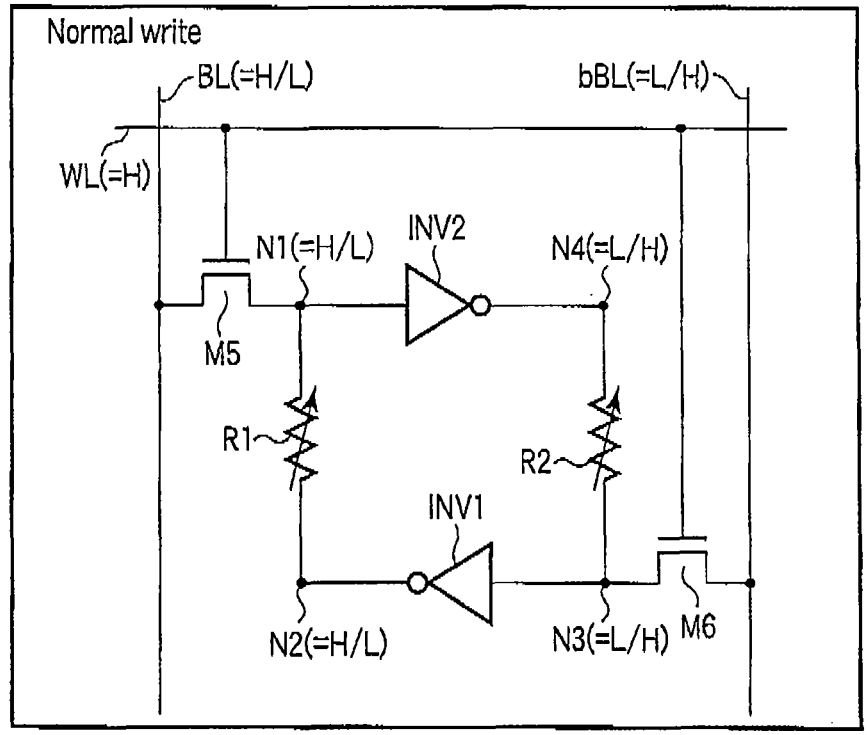
FIG. 5 shows an example of a write operation in a normal mode.

That is, as shown in FIG. 5, first bit line BL is set to first potential ("H"/"L"), output terminal (node) N2 of first inverter INV1 is set to the first potential, second bit line bBL is set to second potential ("L"/"H") and output terminal (node) N4 of second inverter INV2 is set to the second potential.

For example, in two inverters INV1, INV2 that are cross-coupled, "1" is stored as write data DATA when nodes N1, N2 are set at "H" and nodes N3, N4 are set at "L" and "0" is stored as write data DATA when nodes N1, N2 are set at "L" and nodes N3, N4 are set at "H".

B-1-2. Read:

In FIG. 2, control circuit 3 sets word line WL to "H". At this time, data stored in SRAM cell 2 is output as read data items DATA, bDATA to first and second bit lines BL, bBL.

B-2. Nonvolatile Mode:

The nonvolatile mode is a mode in which power supply to the SRAM cell is stopped after data of the SRAM cell is stored in the first and second variable resistive elements as a nonvolatile memory and then data stored in the first and second variable resistive elements as the nonvolatile memory is recalled to the SRAM cell after power supply to the SRAM cell is restarted.

In this case, the operation of storing data of the SRAM cell in the first and second variable resistive elements as the nonvolatile memory is called an NV-write operation and the operation of recalling data stored in the first and second variable resistive elements as the nonvolatile memory into the SRAM cell is called a recall operation.

B-2-1. NV-Write:

The NV-write operation is performed while data stored in the SRAM cell in the normal mode.

The NV-write operation is performed in one of the following two cases, for example.

Figure 6:
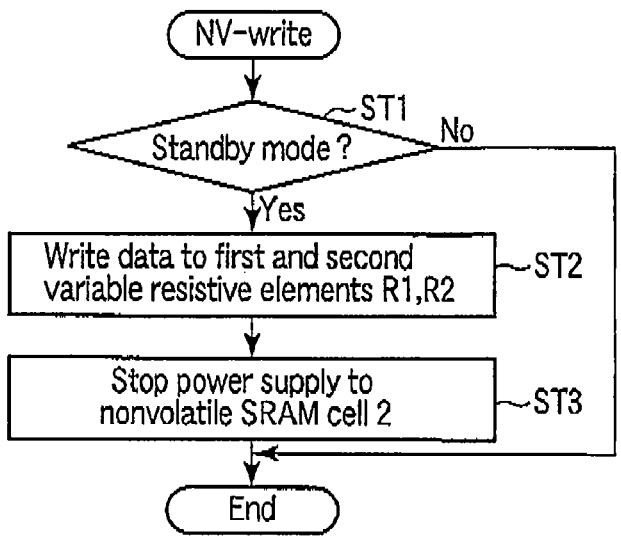
FIGS. 6 and 7 are flow charts, each showing a nonvolatile write operation.

First, as shown in the flowchart of FIG. 6, for example, the NV-write operation is performed when a system (for example, a processor) is set into a standby mode.

Specifically, when the system including the nonvolatile SRAM cell is set into a standby mode, power supply to nonvolatile SRAM cell 2 is turned off to reduce the power consumption after the write operation for first and second variable resistive elements R1, R2 is performed (steps ST1 to ST3).

Figure 7:
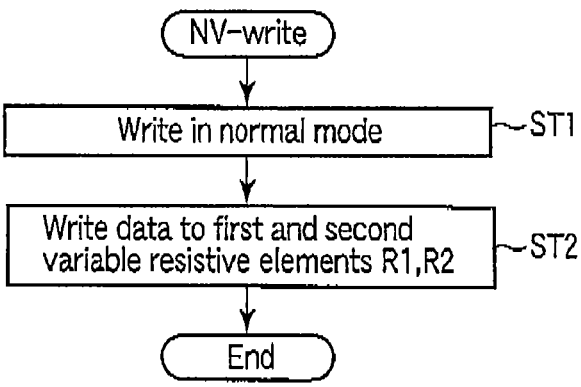

Secondly, as shown in the flowchart of FIG. 7, for example, the NV-write operation is performed after the write operation is performed in the normal mode.

Figure 8:
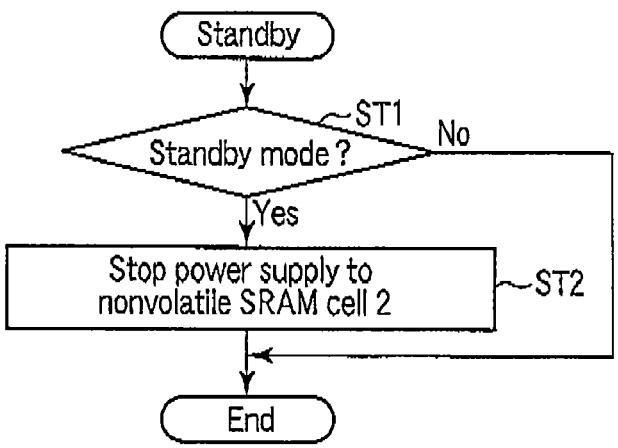
FIG. 8 is a flow chart showing a standby operation.

Specifically, the write operation for first and second variable resistive elements R1, R2 is performed after the write operation for the nonvolatile SRAM cell is performed in the normal mode (steps ST1 to ST2). After this, as shown in FIG. 8, if the standby mode is set, power supply to nonvolatile SRAM cell 2 is turned off to reduce the power consumption (steps ST1 to ST2).

For the latter example, since it becomes unnecessary to perform the NV-write operation immediately after the standby mode is set, power supply to the nonvolatile SRAM cell can be turned off immediately.

Further, in the latter example, since data is always stored in the SRAM cell as the nonvolatile memory, data can be protected even at the unintentional interruption time of power supply.

In the NV-write operation, first, in FIG. 2, control circuit 3 sets first and second bit lines BL, bBL to the same potential and turns on first and second transistors M5, M6 while volatile data is kept stored in nonvolatile SRAM cell 2.

At this time, a write current flows through (or an electric field is applied to) one of first and second variable resistive elements R1, R2 and the resistance value thereof is changed. Therefore, the resistance values of first and second variable resistive elements R1, R2 become different from each other and, as a result, nonvolatile data is stored in nonvolatile SRAM cell 2.

In this case, in the NV-write operation, first and second bit lines BL, bBL are both set to "H".

B-2-1-1. First and Second Bit Lines BL, bBL are Set to "H":

When first and second variable resistive elements R1, R2 are both reset to the low resistance value by the reset operation shown in FIG. 4, the NV-write operation is performed by the following method.

Figure 9:
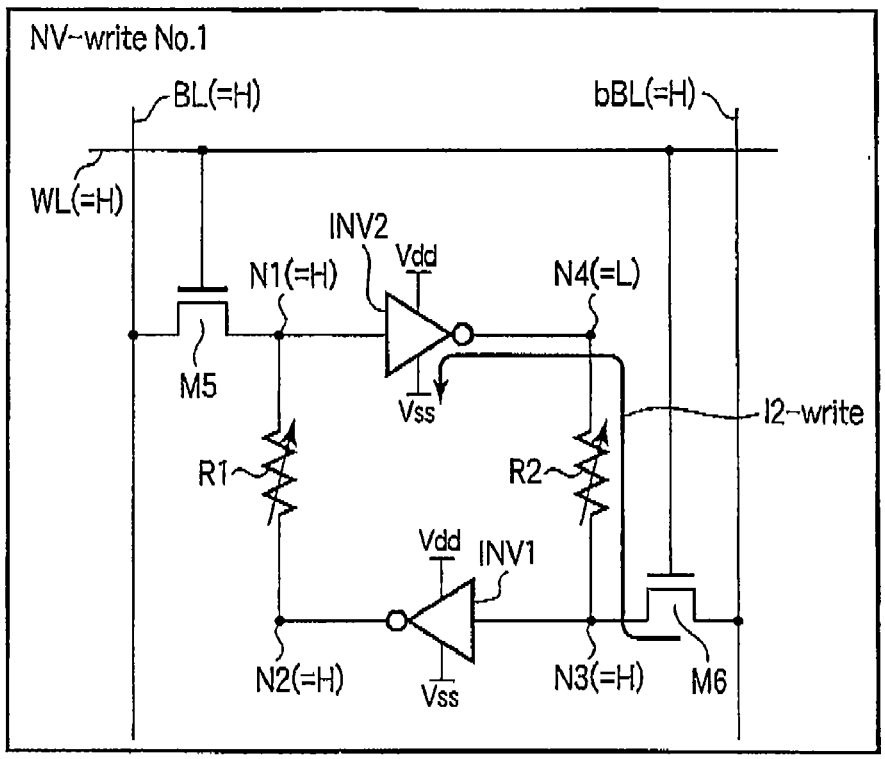
FIGS. 9 and 10 show examples of the nonvolatile write operation.

For example, as shown in FIG. 9, when "1" is stored in the nonvolatile SRAM cell at the normal mode time, node N2 is set at "H" and node N4 is set at "L". In this state, first and second bit lines BL, bBL are both set to "H" and word line WL is set to "H" to turn on first and second transistors M5, M6.

At this time, since nodes N1, N2 at both ends of first variable resistive element R1 are both set to "H", no write current flows through (or no electric field is applied to) first variable resistive element R1 and the resistance value of first variable resistive element R1 is kept unchanged. That is, the resistance value of first variable resistive element R1 is kept at the first resistance value (low resistance value).

On the other hand, since node N3 at one end of second variable resistive element R2 is set to "H" and node N4 at the other end thereof is set to "L", write current I2-write flows through (or an electric field is applied to) second variable resistive element R2 and the resistance value of second variable resistive element R2 is changed. That is, the resistance value of second variable resistive element R2 is changed from the first resistance value (low resistance value) to the second resistance value (high resistance value).

As a result, a state in which the resistance value of second variable resistive element R2 is higher than the resistance value of first variable resistive element R1 is set and "1" is stored in the nonvolatile SRAM cell as the nonvolatile memory.

Since the write current flows through the variable resistive element depending on data in the nonvolatile SRAM cell stored at the write operation in the normal mode time, the operation of reading the cell data before the NV-write operation is not required.

Figure 10:
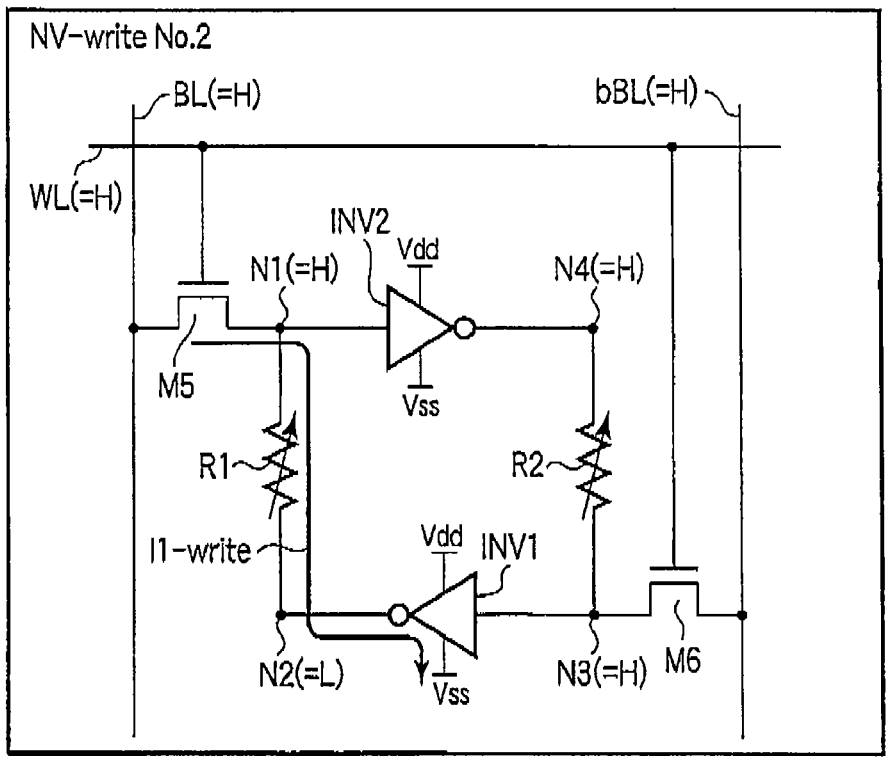

Further, for example, when "0" is stored in the nonvolatile SRAM cell at the normal mode time as shown in FIG. 10, node N2 is set at "L" and node N4 is set at "H". In this state, first and second bit lines BL, bBL are both set to "H" and word line WL is set to "H" to turn on first and second transistors M5, M6.

At this time, since node N1 at one end of first variable resistive element R1 is set to "H" and node N2 at the other end thereof is set to "L", write current I1-write flows through (or an electric field is applied to) first variable resistive element R1 and the resistance value of first variable resistive element R1 is changed. That is, the resistance value of first variable resistive element R1 is changed from the first resistance value (low resistance value) to the second resistance value (high resistance value).

On the other hand, since nodes N3, N4 at both ends of second variable resistive element R2 are set to "H", no write current flows through (no electric field is applied to) second variable resistive element R2 and the resistance value of second variable resistive element R2 is not changed. That is, the resistance value of second variable resistive element R2 is kept at the first resistance value (low resistance value).

As a result, a state in which the resistance value of first variable resistive element R1 is higher than the resistance value of second variable resistive element R2 is set and "0" is stored in the nonvolatile SRAM cell as the nonvolatile memory.

B-2-2. Recall:

If the standby mode is released in the system including the nonvolatile SRAM cell, the recall operation of recalling data stored in the first and second variable resistive elements as the nonvolatile memory to the SRAM cell is performed.

The recall operation is automatically performed by supplying power source voltage Vdd to the SRAM cell (first and second inverters INV1, INV2) while word line WL is kept set at "L".

B-2-2-1. R1<R2:

A state in which first variable resistive element R1 is set at the low resistance value and second variable resistive element R2 is set at the high resistance value by the NV-write operation is explained. This state is a state in which "1" is stored in the nonvolatile SRAM cell as the nonvolatile memory.

Figure 11:
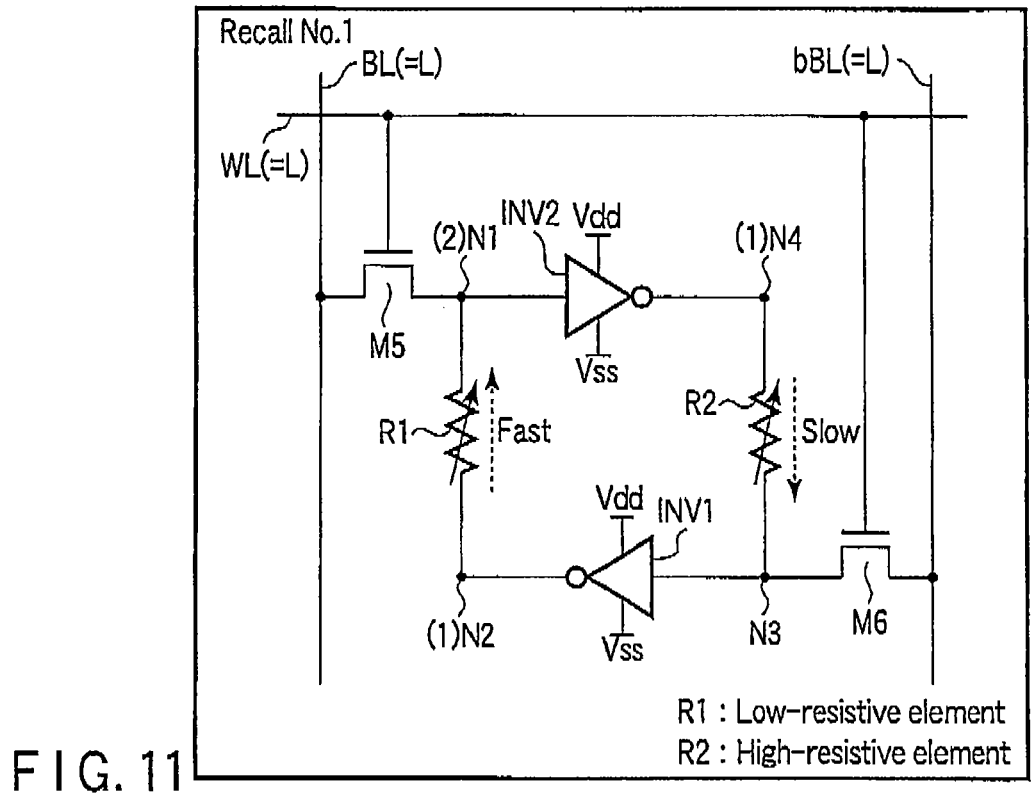
FIGS. 11 and 12 show examples of a recall operation.

In this case, if power source voltage Vdd is applied to inverters INV1, INV2 as shown in FIG. 11, first, leak currents flow in inverters INV1, INV2 and the potentials of output terminals (nodes) N2, N4 of inverters INV1, INV2 are raised.

After this, the potentials of nodes N1, N3 are raised.

At this time, since the resistance value of second variable resistive element R2 is higher than the resistance value of first variable resistive element R1, the propagation speed of the potential of node N4 to node N3 is lower than the transmission speed of the potential of node N2 to node N1.

Therefore, input terminal (node) N1 of inverter INV2 is first set to "H" earlier than input terminal (node) N3 of inverter INV1.

As a result, nodes N1, N2 are set to "H" and nodes N3, N4 are set to "L" to correctly recall data "1" to the nonvolatile SRAM cell.

B-2-2-2. R1>R2:

A state in which first variable resistive element R1 is set at the high resistance value and second variable resistive element R2 is set at the low resistance value by the NV-write operation is explained. This state is a state in which "0" is stored in the nonvolatile SRAM cell as the nonvolatile memory.

Figure 12:
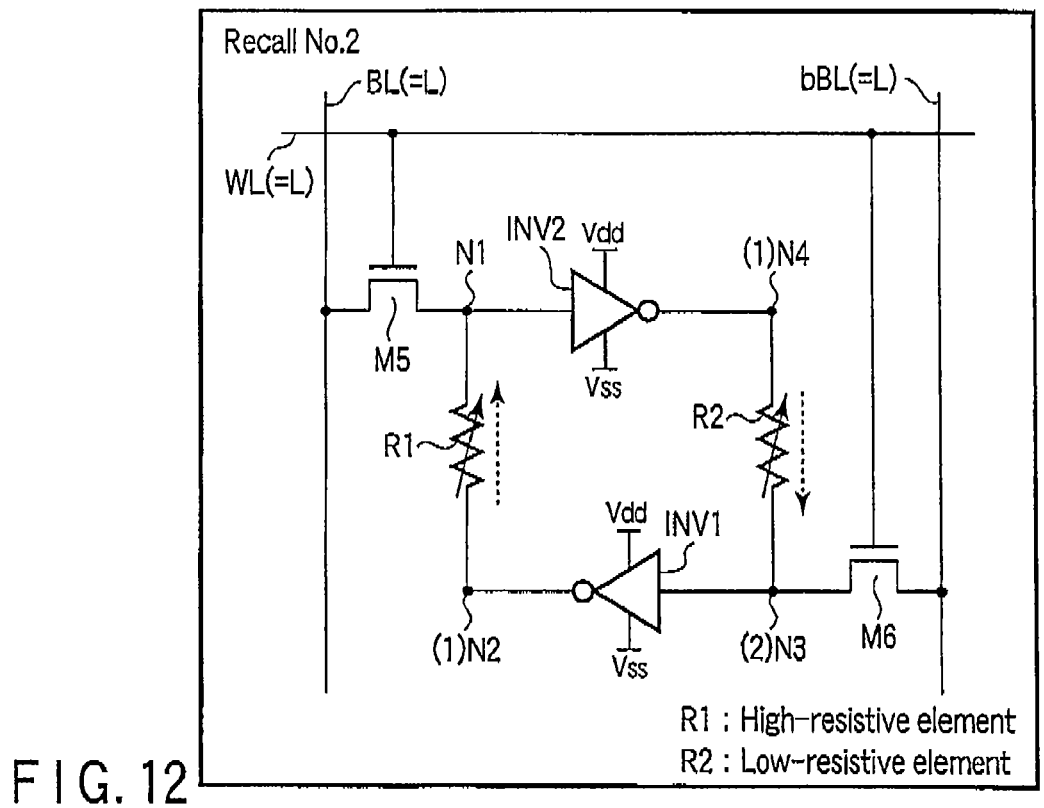

In this case, if power source voltage Vdd is applied to inverters INV1, INV2 as shown in FIG. 12, first, leak currents flow in inverters INV1, INV2 and the potentials of output terminals (nodes) N2, N4 of inverters INV1, INV2 are raised.

After this, the potentials of nodes N1, N3 are raised.

At this time, since the resistance value of first variable resistive element R1 is higher than the resistance value of second variable resistive element R2, the propagation speed of the potential of node N2 to node N1 is lower than the propagation speed of the potential of node N4 to node N3.

Therefore, input terminal (node) N3 of inverter INV1 is first set to "H" earlier than input terminal (node) N1 of inverter INV2.

As a result, nodes N1, N2 are set to "L" and nodes N3, N4 are set to "H" to correctly recall data "0" to the nonvolatile SRAM cell.

(3) Advantage

As described above, according to the present disclosure, a nonvolatile SRAM cell including a basic circuit having a small cell area, that is, the same number of transistors as that of a volatile SRAM cell and having a basic operation for reducing power consumption at the standby mode time can be realized.

2. Embodiments

(1) First Embodiment

FIG. 13 shows a first embodiment.

A nonvolatile SRAM cell includes first and second inverters INV1, INV2, first transistor M5 having a gate connected to word line WL, a source connected to first bit line BL and a drain connected to the input terminal of second inverter INV2, and second transistor M6 having a gate connected to word line WL, a source connected to second bit line bBL and a drain connected to the input terminal of first inverter INV1.

Further, the nonvolatile SRAM cell includes first magnetoresistive element MTJ1 having a first terminal connected to the drain of first transistor M5 and a second terminal connected to the output terminal of first inverter INV1, and second magnetoresistive element MTJ2 having a first terminal connected to the drain of second transistor M6 and a second terminal connected to the output terminal of second inverter INV2.

First inverter INV1 is configured by P-channel MOSFET M1 and N-channel MOSFET M2 that are serially connected between two power source terminals Vdd and Vss. Further, second inverter INV2 is configured by P-channel MOSFET M3 and N-channel MOSFET M4 that are serially connected between two power source terminals Vdd and Vss.

Each of first and second magnetoresistive elements MTJ1, MTJ2 is a perpendicular magnetic tunnel junction including magnetic pinned layer 11, magnetic free layer 12 and tunnel barrier layer 13 disposed therebetween.

Magnetic pinned layer 11 of first magnetoresistive element MTJ1 is connected to the output terminal of first inverter INV1 and magnetic free layer 12 of first magnetoresistive element MTJ1 is connected to the drain of first transistor M5.

Magnetic pinned layer 11 of second magnetoresistive element MTJ2 is connected to the output terminal of second inverter INV2 and magnetic free layer 12 of second magnetoresistive element MTJ2 is connected to the drain of second transistor M6.

It is supposed that each of first and second magnetoresistive elements MTJ1, MTJ2 is changed from the high resistance value to the low resistance value when a write current is passed from magnetic pinned layer 11 to magnetic free layer 12 and is changed from the low resistance value to the high resistance value when a write current is passed from magnetic free layer 12 to magnetic pinned layer 11.

With the above configuration, the potentials of word line WL and first and second bit lines BL, bBL are controlled to perform the reset/write/read operation.

Figure 14:
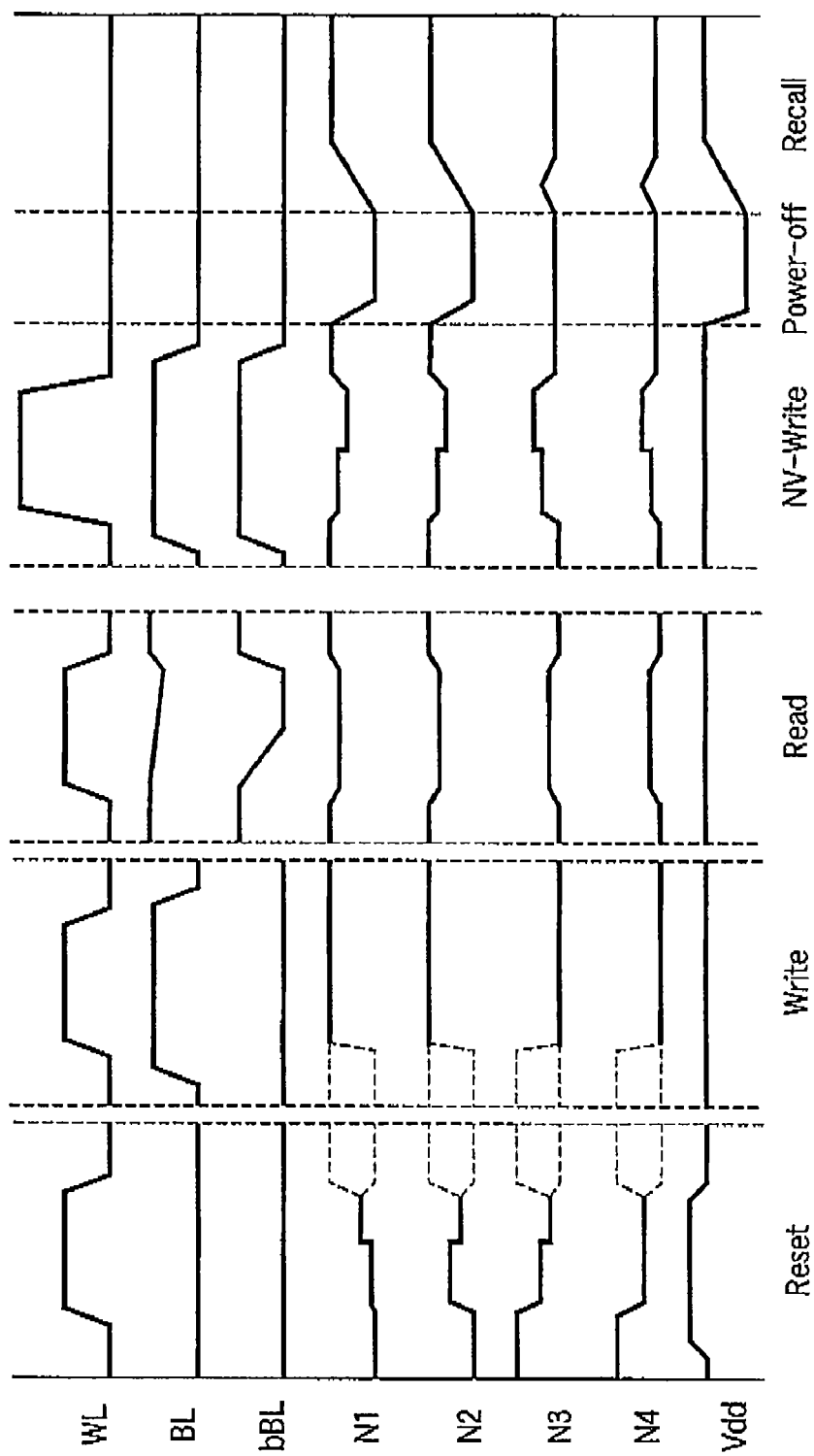

FIG. 14 shows a first example of the operation of the nonvolatile SRAM cell of FIG. 13.

In the reset operation, word line WL is set to "H" and first and second bit lines BL, bBL are set to "L". At this time, since a write current flows from magnetic pinned layer 11 to magnetic free layer 12 in each of first and second magnetoresistive elements MTJ1, MTJ2 are set to the low resistance value. If a reset current is insufficient with respect to the write current of magnetoresistive elements MTJ1, MTJ2, this case can be coped with by setting power source voltage Vdd to potential higher than normal power source potential Vdd as shown in FIG. 14.

The write/read operation in the normal mode is performed as in the volatile SRAM cell.

For example, in the write operation, word line WL is set to "H", first bit line BL is set to "H" and second bit line bBL is set to "L" to store "1" (nodes N1, N2="H" and nodes N3, N4="L") in the nonvolatile SRAM cell.

Further, in the read operation, first and second bit lines BL, bBL are previously precharged and then word line WL is set to "H" to cause potential difference between first and second bit lines BL and bBL. Data of the SRAM cell can be read by sensing the potential difference by means of a sense amplifier.

At the write/read time, currents flow through first and second magnetoresistive elements MTJ1, MTJ2.

However, the time during which currents flow through first and second magnetoresistive elements MTJ1, MTJ2 at the write time is approximately 0.1 psec.

Further, the time during which currents flow through first and second magnetoresistive elements MTJ1, MTJ2 at the read time depends on the generation of the transistors, the resistance value of the magnetoresistive element reset in the low resistance state, the wiring resistance values of bit lines BL, bBL to the sense amplifier, wiring capacitance values thereof and the like. For example, in the 65 nm generation, if the resistance value of the magnetoresistive element reset in the low resistance state is 4 k$\Omega$, the wiring resistance values of bit line pair BL, bBL to the sense amplifier and wiring capacitance values thereof are respectively approximately 200$\Omega$ and approximately 14 fF, then the time during which a current of 50 uA or more flows is approximately 1.5 nsec.

Therefore, the write operation for first and second magnetoresistive elements MTJ1, MTJ2 is not performed at the write/read time in the normal mode. Further, when it is predicted to perform the write operation, this case can be avoided by changing the above wiring condition or the like. In addition, since the directions of currents flowing through first and second magnetoresistive elements MTJ1, MTJ2 at the read time are set in the same condition in which a write current flows at the NV-write time, there occurs no problem even if the write operation is performed.

If the system is set in the standby mode, the NV-write operation is performed before power supply to the nonvolatile SRAM cell is turned off.

In the NV-write operation, for example, word line WL is set to "H" and first and second bit lines BL, bBL are set to "H" to perform the write operation for first and second magnetoresistive elements MTJ1, MTJ2.

In this example, since the nonvolatile SRAM cell stores "1" in the write operation in the normal mode, first magnetoresistive element MTJ1 is set to the low resistance value and second magnetoresistive element MTJ2 is set to the high resistance value in the NV-write operation.

Specifically, when the nonvolatile SRAM cell stores "1", nodes N1, N2 are set at "H" and nodes N3, N4 are set at "L". Therefore, when first and second bit lines BL, bBL are set to "H", a write current flows only in second magnetoresistive element MTJ2 from magnetic free layer 12 to magnetic pinned layer 11. If a write current is insufficient with respect to a write current of magnetoresistive element MTJ2, this case can be coped with by setting the potential of word line WL to potential higher than normal power source potential Vdd as shown in FIG. 14.

Therefore, first magnetoresistive element MTJ1 is kept at the low resistance value and second magnetoresistive element MTJ2 is changed from the low resistance value to the high resistance value.

When the NV-write operation ends, power supply to the nonvolatile SRAM cell is turned off.

When the standby mode ends and power supply to the nonvolatile SRAM cell is turned on, the recall operation is performed.

When power source voltage Vdd is applied to inverters INV1, INV2 by supplying electric power to the nonvolatile SRAM cell, first, leak currents flow through inverters INV1, INV2 and the potentials of output terminals (nodes) N2, N4 of inverters INV1, INV2 are raised.

After this, the potentials of nodes N1, N3 are raised.

At this time, since the resistance value of second magnetoresistive element MTJ2 is higher than the resistance value of first magnetoresistive element MTJ1, the propagation speed of the potential of node N4 to node N3 is lower than the transmission speed of the potential of node N2 to node N1.

Therefore, input terminal (node) N1 of inverter INV2 is first set to "H" earlier than input terminal (node) N3 of inverter INV1.

As a result, nodes N1, N2 are set to "H" and nodes N3, N4 are set to "L" to recall "1" to the nonvolatile SRAM cell.

In an LSI utilizing an advanced process, there occurs a problem that a variation in the threshold voltage of the transistor becomes large. If a variation in the threshold voltage of the transistor is large, erroneous data may be recalled in some cases. In order to prevent this, a method shown in FIG. 15 may be used.

The feature of this method is that voltage of word line WL is changed in an order of "L"→"H"→"L" while first and second bit lines BL, bBL are kept at "L".

When a power source voltage is applied to the SRAM cell while word line WL is kept at "L" and first and second bit lines BL, bBL are kept at "L", data is recalled depending on a variation in the threshold voltage of the transistor. After this, if word line WL is changed in an order of "L"→"H"→"L", the potentials at both ends of the magnetoresistive element having the low resistance value become higher than the potentials at both ends of the magnetoresistive element having the high resistance value and the recall operation is correctly performed.

(2) Second Embodiment

FIG. 17 shows a second embodiment.

The second embodiment is different from the first embodiment in that the positions of the magnetic pinned layers and magnetic free layers of first and second magnetoresistive elements MTJ1, MTJ2 are reversed.

A nonvolatile SRAM cell includes first and second inverters INV1, INV2, first transistor M5 having a gate connected to word line WL, a source connected to first bit line BL and a drain connected to the input terminal of second inverter INV2, and second transistor M6 having a gate connected to word line WL, a source connected to second bit line bBL and a drain connected to the input terminal of first inverter INV1.

Further, the nonvolatile SRAM cell includes first magnetoresistive element MTJ1 having a first terminal connected to the drain of first transistor M5 and a second terminal connected to the output terminal of first inverter INV1, and second magnetoresistive element MTJ2 having a first terminal connected to the drain of second transistor M6 and a second terminal connected to the output terminal of second inverter INV2.

First inverter INV1 is configured by P-channel MOSFET M1 and N-channel MOSFET M2 that are serially connected between two power source terminals Vdd and Vss. Further, second inverter INV2 is configured by P-channel MOSFET M3 and N-channel MOSFET M4 that are serially connected between two power source terminals Vdd and Vss.

Each of first and second magnetoresistive elements MTJ1, MTJ2 is a perpendicular magnetic tunnel junction including magnetic pinned layer 11, magnetic free layer 12 and tunnel barrier layer 13 disposed therebetween.

Magnetic pinned layer 11 of first magnetoresistive element MTJ1 is connected to the drain of first transistor M5 and magnetic free layer 12 of first magnetoresistive element MTJ1 is connected to the output terminal of first inverter INV1.

Magnetic pinned layer 11 of second magnetoresistive element MTJ2 is connected to the drain of second transistor M6 and magnetic free layer 12 of second magnetoresistive element MTJ2 is connected to the output terminal of second inverter INV2.

It is supposed that each of first and second magnetoresistive elements MTJ1, MTJ2 is changed from a high resistance value to a low resistance value when a write current is passed from magnetic pinned layer 11 to magnetic free layer 12 and is changed from the low resistance value to the high resistance value when a write current is passed from magnetic free layer 12 to magnetic pinned layer 11.

With the above configuration, the potentials of word line WL and first and second bit lines BL, bBL are controlled to perform the reset/write/read operation.

The write/read operation can be performed in the same condition as in the first embodiment (FIGS. 14 to 15), and therefore, the detailed explanation thereof is omitted here.

Figure 16:
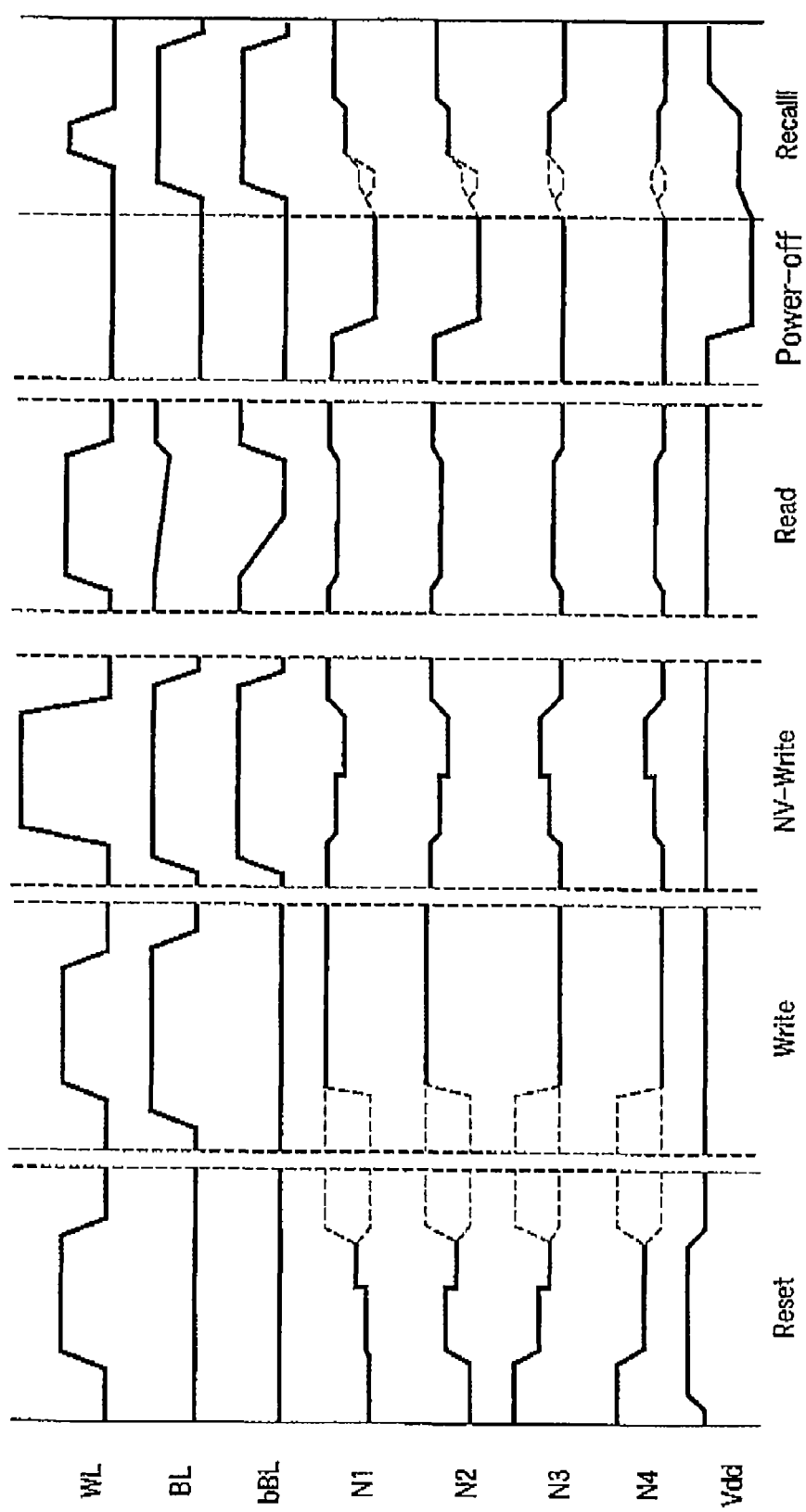

FIG. 16 shows the operation of the nonvolatile SRAM cell of FIG. 17.

The feature of the second embodiment is that a write operation (NV-write) in a nonvolatile mode is continuously performed after a write operation in a normal mode is performed. In this embodiment, since a static noise margin (SNM) is larger and more stable in a state after the NV-write operation is performed than in a state after resetting, it is desirable to continuously perform the NV-write operation after the write operation in the normal mode is performed. However, if there occurs a problem that the performance of a system is degraded by continuously performing the NV-write operation, the NV-write operation may be performed in free time in which no access is made from the other device.

In this case, since it is unnecessary to perform the NV-write operation after the standby mode is set, power supply to the nonvolatile SRAM cell is immediately stopped when the standby mode is set to reduce the power consumption.

Further, in the second embodiment, since data is always stored in the SRAM cell as a nonvolatile memory, data can be protected when power supply is unexpectedly turned off.

In the reset operation, word line WL is set to "H" and first and second bit lines BL, bBL are set to "L". At this time, since a write current flows from magnetic free layer 12 to magnetic pinned layer 11 in each of first and second magnetoresistive elements MTJ1, MTJ2 are both set to the high resistance value. If a reset current is insufficient for the write current of each of magnetoresistive elements MTJ1, MTJ2, this case can be coped with by setting power source voltage Vdd to potential higher than normal power source potential Vdd as shown in FIG. 14.

The write/read operation can be performed in the same condition as in the first embodiment (FIG. 14), and therefore, the detailed explanation thereof is omitted here.

For example, in the NV-write operation, word line WL is set to "H" and first and second bit lines BL, bBL are set to "H" to perform the write operation for first and second magnetoresistive elements MTJ1, MTJ2.

In this example, since the nonvolatile SRAM cell stores "1" in the write operation in the normal mode, first magnetoresistive element MTJ1 is set to the high resistance value and second magnetoresistive element MTJ2 is set to the low resistance value in the NV-write operation.

Specifically, when the nonvolatile SRAM cell stores "1", nodes N1, N2 are set at "H" and nodes N3, N4 are set at "L". Therefore, if first and second bit lines BL, bBL are set to "H", a write current flows from magnetic pinned layer 11 to magnetic free layer 12 only in second magnetoresistive element MTJ2. If the write current is insufficient for the write current of second magnetoresistive element MTJ2, this case can be coped with by setting the potential of word line WL to potential higher than normal power source potential Vdd as shown in FIG. 17.

Therefore, first magnetoresistive element MTJ1 is kept at the high resistance value and second magnetoresistive element MTJ2 is changed from the high resistance value to the low resistance value.

In the recall operation, a method for raising power source voltage Vdd at two stages is used.

For example, power source voltage Vdd is first raised to a first level (V-recall) to recall data that depends on a threshold variation of the transistor while word line WL is set at "L" and first and second bit lines BL, bBL are set at "L". It is supposed that the first level is a value smaller than (H level of power source voltage Vdd)—(threshold voltage Vthn of N-channel MOSFET).

After this, first and second bit lines BL, bBL are set to "H". Then, when word line WL is changed in an order of "L"→"H"→"L", the potentials at both ends of the magnetoresistive element having the low resistance value become lower than the potentials at both ends of the magnetoresistive element having the high resistance value. Further, if power source voltage Vdd is set to a second level ("H"), the potentials at both ends of the magnetoresistive element having the high resistance value are fixedly set at "H", the potentials at both ends of the magnetoresistive element having the low resistance value are fixedly set at "L" and the recall operation is correctly performed.

The above method is suitable for a case wherein nonvolatile SRAM cells are arranged in a matrix form configured by word lines and power source voltage Vdd is commonly controlled. For example, when the matrix is formed of word line WL1 to word line WL10, power source voltage Vdd is raised to the first level and then a change of "L"→"H"→"L" is sequentially made in an order from word line WL1 to word line WL10. Subsequently, power source voltage Vdd is set to the second level ("H") and then the recall operation for all of the nonvolatile SRAM cells connected to word line WL1 to word line WL10 is terminated.

If nonvolatile SRAM cells are not arranged in the matrix form as described above or power source voltage Vdd is not commonly controlled, it is not always necessary to raise the voltage at two stages.

Specifically, word line WL is changed from "L" to "H" while first and second bit lines BL, bBL are kept set at "L". Then, if power source voltage Vdd is raised to "H", the potentials at both ends of a magnetoresistive element having a high resistance value are fixedly set at "H" and the potentials at both ends of a magnetoresistive element having a low resistance value are fixedly set at "L". When data is fixedly set, word line WL is changed from "H" to "L" and then the recall operation for all of the nonvolatile SRAM cells connected to word line WL is terminated.

(3) Third Embodiment

FIG. 18 shows a third embodiment.

The feature of the third embodiment is that an equalizer that sets equal the potentials of first and second bit lines BL, bBL is provided. Since an NV-write operation is performed on the assumption that the potentials of first and second bit lines BL, bBL are set equal, the equalizer is extremely effective in correctly performing the NV-write operation.

As the equalizer, an equalizer provided in the conventional SRAM may be used as it is.

A nonvolatile SRAM cell includes first and second inverters INV1, INV2, first transistor M5 having a gate connected to word line WL, a source connected to first bit line BL and a drain connected to the input terminal of second inverter INV2, and second transistor M6 having a gate connected to word line WL, a source connected to second bit line bBL and a drain connected to the input terminal of first inverter INV1.

Further, the nonvolatile SRAM cell includes first variable resistive element R1 having a first terminal connected to the drain of first transistor M5 and a second terminal connected to the output terminal of first inverter INV1, and second variable resistive element R2 having a first terminal connected to the drain of second transistor M6 and a second terminal connected to the output terminal of second inverter INV2.

In addition, the nonvolatile SRAM cell includes a third transistor (FET) M7 having a source and drain connected to first and second bit lines BL, bBL and a gate to which control signal NVWEQ is input. For example, control signal NVWEQ is set to "H" at the NV-write operation time to set equal the potentials of bit lines BL, bBL.

First inverter INV1 is configured by P-channel MOSFET M1 and N-channel MOSFET M2 that are serially connected between two power source terminals Vdd and Vss. Further, second inverter INV2 is configured by P-channel MOSFET M3 and N-channel MOSFET M4 that are serially connected between two power source terminals Vdd and Vss.

With the above configuration, the potentials of word line WL and first and second bit lines BL, bBL are controlled to perform the reset/write/read operation.

The reset/write/read operation is already explained in the basic operation (FIGS. 2 to 12), and therefore, the detailed explanation thereof is omitted here.

In the third embodiment, a difference between the potentials of bit lines BL, bBL can be prevented from occurring at the NV-write operation time. Further, since it is sufficient to provided one equalizer for bit lines BL, bBL, provision of the equalizer will not increase the area of the nonvolatile SRAM cell.

(4) Fourth Embodiment

Figure 19:
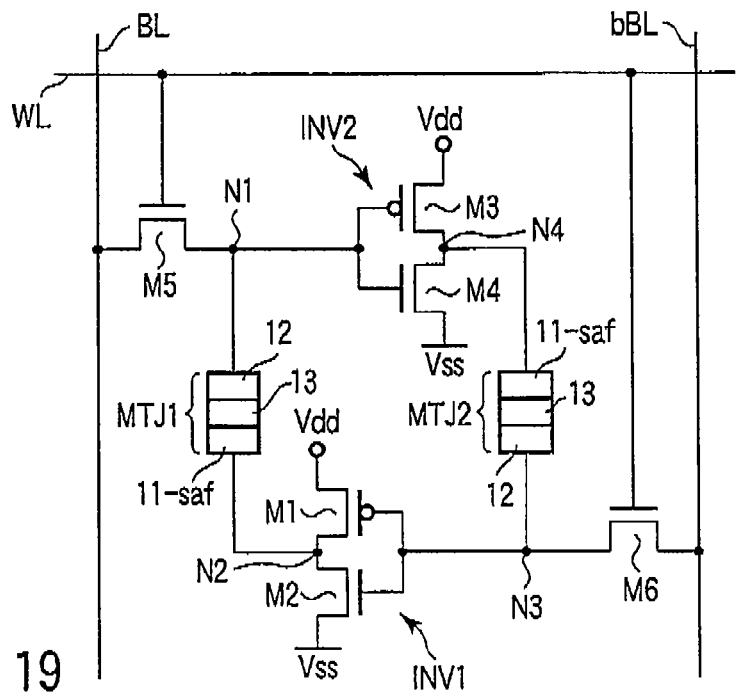
FIG. 19 shows a circuit of a fourth embodiment.

FIG. 19 shows a fourth embodiment.

The fourth embodiment is a modification of the first embodiment. The fourth embodiment is different from the first embodiment in that magnetic pinned layers 11 of first and second magnetoresistive elements MTJ1, MTJ2 have synthetic antiferromagnet (SAF) structures.

The SAF structure is a structure that has a laminated structure of ferromagnetic layer/nonmagnetic layer/ferromagnetic layer and in which the two ferromagnetic layers are coupled in an antiferromagnetic form.

Recently, since it is found that the magnetoresistive element with the above structure exhibits a property that the resistance value thereof can be changed or cannot be changed (a unipolar write operation can be performed) according to a difference in the magnitude of a write current, the NV-write operation can be performed by use of the property.

A nonvolatile SRAM cell includes first and second inverters INV1, INV2, first transistor M5 having a gate connected to word line WL, a source connected to first bit line BL and a drain connected to the input terminal of second inverter INV2, and second transistor M6 having a gate connected to word line WL, a source connected to second bit line bBL and a drain connected to the input terminal of first inverter INV1.

Further, the nonvolatile SRAM cell includes first magnetoresistive element MTJ1 having a first terminal connected to the drain of first transistor M5 and a second terminal connected to the output terminal of first inverter INV1, and second magnetoresistive element MTJ2 having a first terminal connected to the drain of second transistor M6 and a second terminal connected to the output terminal of second inverter INV2.

First inverter INV1 is configured by P-channel MOSFET M1 and N-channel MOSFET M2 that are serially connected between two power source terminals Vdd and Vss. Further, second inverter INV2 is configured by P-channel MOSFET M3 and N-channel MOSFET M4 that are serially connected between two power source terminals Vdd and Vss.

Each of first and second magnetoresistive elements MTJ1, MTJ2 is a spin-transfer type magnetoresistive element including magnetic pinned layer 11, magnetic free layer 12 and tunnel barrier layer 13 disposed therebetween.

Magnetic pinned layer 11 of first magnetoresistive element MTJ1 is connected to the drain of first transistor M5 and magnetic free layer 12 of first magnetoresistive element MTJ1 is connected to the output terminal of first inverter INV1.

Magnetic pinned layer 11 of second magnetoresistive element MTJ2 is connected to the drain of second transistor M6 and magnetic free layer 12 of second magnetoresistive element MTJ2 is connected to the output terminal of second inverter INV2.

In each of first and second magnetoresistive elements MTJ1, MTJ2, for example, magnetic pinned layer 11 is formed with a stack structure of ferromagnetic metal 1/nonmagnetic metal/ferromagnetic metal 1 and magnetic free layer 12 is formed of ferromagnetic metal 2.

For example, ferromagnetic metal 1 is GdFeCo, ferromagnetic metal 2 is TbFeCo and nonmagnetic metal is Cu. Tunnel barrier layer 13 is MgO.

It is supposed that each of first and second magnetoresistive elements MTJ1, MTJ2 is changed from a high resistance value to a low resistance value when a write current (small current) having a first value is passed from magnetic pinned layer 11 to magnetic free layer 12 and is changed from the low resistance value to the high resistance value when a write current (large current) having a second value larger than the first value is passed from magnetic pinned layer 11 to magnetic free layer 12.

With the above configuration, the potentials of word line WL and first and second bit lines BL, bBL are controlled to perform the reset/write/read operation.

Figure 20:
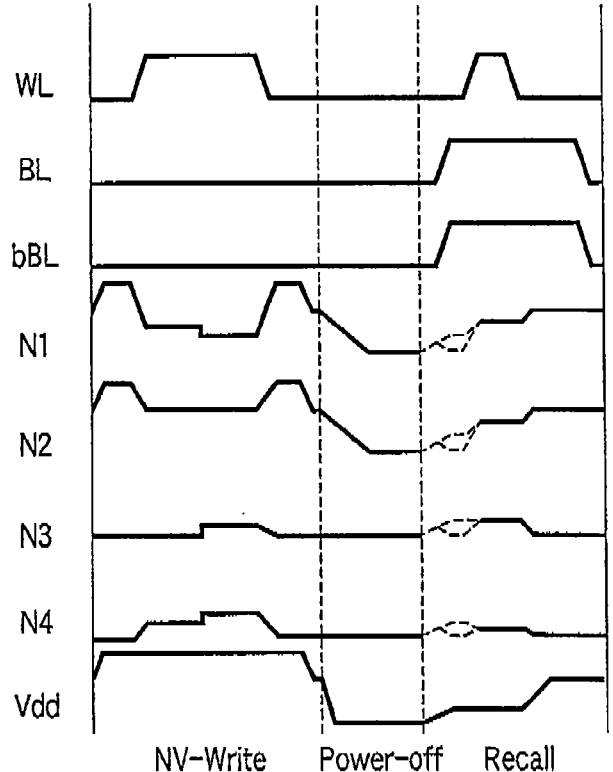
FIG. 20 shows an operation of the fourth embodiment.

FIG. 20 shows an example of the operation of the nonvolatile SRAM cell of FIG. 19.

The write/read operation in the normal mode can be performed in the same manner as in the first embodiment (FIGS. 14 and 15), and therefore, the detailed explanation thereof is omitted here.

In the NV-write operation, for example, word line WL is set to "H" and first and second bit lines BL, bBL are set to "L" to perform the write operation for first and second magnetoresistive elements MTJ1, MTJ2.

First, it is assumed that the nonvolatile SRAM cell stores "1" in the write operation in the normal mode. In this case, a write operation is performed to set first magnetoresistive element MTJ1 to the high resistance value and set second magnetoresistive element MTJ2 to the low resistance value in the NV-write operation.

Specifically, when the nonvolatile SRAM cell stores "1", for example, nodes N1, N2 are set to "H" and nodes N3, N4 are set to "L" in FIG. 19. Therefore, if first and second bit lines BL, bBL are set to "L" and the power source voltage is set to "H-up", a write current flows from magnetic pinned layer 11 to magnetic free layer 12 in each of first and second magnetoresistive elements MTJ1, MTJ2. In this case, "H-up" indicates potential higher than "H (for example, power source potential Vdd)".

As a result, a write current flowing in first magnetoresistive element MTJ1 becomes large, a write current flowing in second magnetoresistive element MTJ2 becomes small, first magnetoresistive element MTJ1 is changed to the high resistance value and second magnetoresistive element MTJ2 is changed to the low resistance value.

As described above, the NV-write operation for data "1" is terminated.

Next, it is assumed that the nonvolatile SRAM cell stores "0" in the write operation in the normal mode. In this case, a write operation is performed to set first magnetoresistive element MTJ1 to the low resistance value and set second magnetoresistive element MTJ2 to the high resistance value in the NV-write operation.

Specifically, when the nonvolatile SRAM cell stores "0", for example, nodes N1, N2 are set to "L" and nodes N3, N4 are set to "H" in FIG. 19. Therefore, if first and second bit lines BL, bBL are set to "L" and the power source voltage is set to "H-up", a write current flows from magnetic pinned layer 11 to magnetic free layer 12 in each of first and second magnetoresistive elements MTJ1, MTJ2. In this case, "H-up" indicates potential higher than "H (for example, power source potential Vdd)".

As a result, a write current flowing in first magnetoresistive element MTJ1 becomes small, a write current flowing in second magnetoresistive element MTJ2 becomes large, first magnetoresistive element MTJ1 is changed to the low resistance value and second magnetoresistive element MTJ2 is changed to the high resistance value.

As described above, the NV-write operation for data "0" is terminated.

After the NV-write operation, power supply to the nonvolatile SRAM cell is stopped and then the recall operation is performed when power supply to the nonvolatile SRAM cell is restarted.

The recall operation can be performed in the same manner as in the second embodiment (FIG. 16), and therefore, the detailed explanation thereof is omitted here.

In the fourth embodiment, it is assumed that magnetic pinned layers 11 of first and second magnetoresistive elements MTJ1, MTJ2 have SAF structures.

However, the present embodiment can be applied to a magnetoresistive element even if the magnetoresistive element has no SAF structure when the unipolar write operation (the write operation for changing the resistance value by changing the magnitude of a write current with the direction thereof kept unchanged) can be performed.

(5) Fifth Embodiment

FIGS. 21 to 25 show a fifth embodiment.

Figure 21:
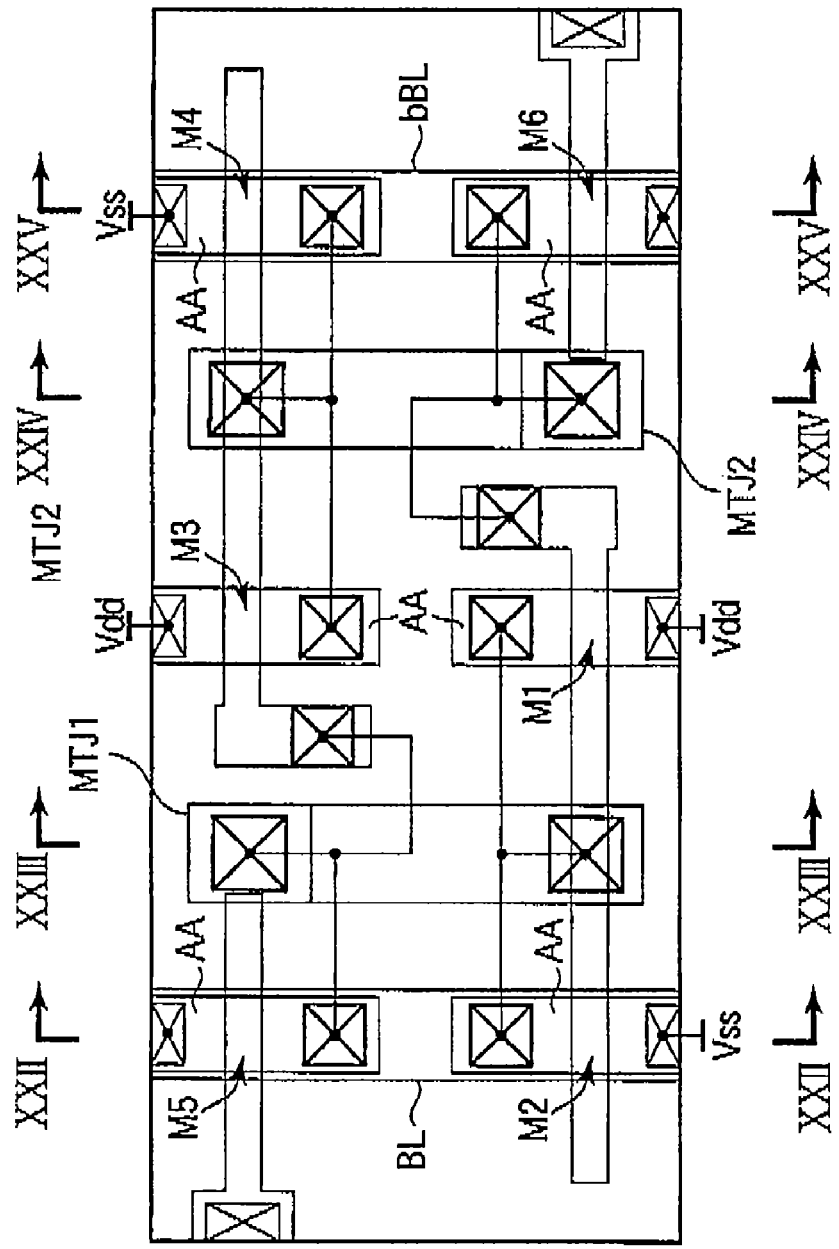
FIG. 21 shows a layout of a fifth embodiment.
Figure 24:
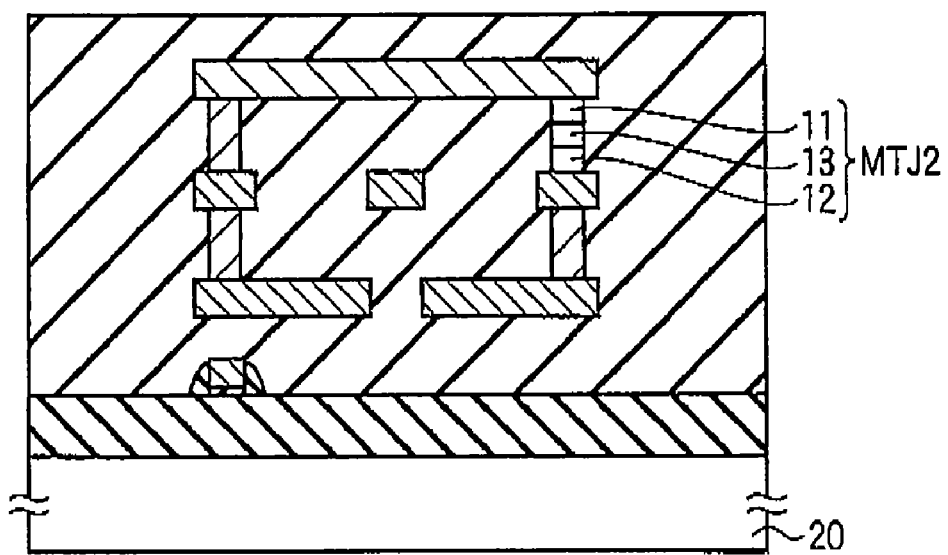
FIG. 24 is a cross-sectional view along with XXIV-XXIV of FIG. 21.
Figure 25:
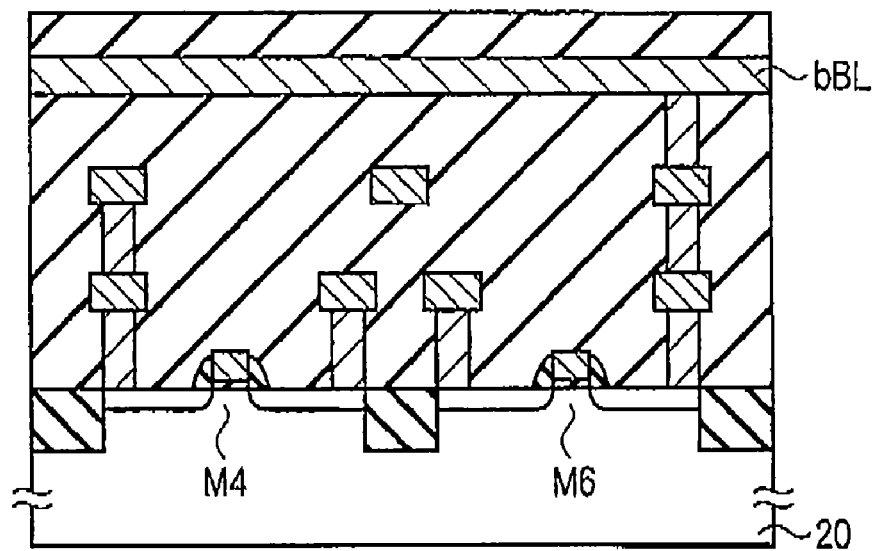
FIG. 25 is a cross-sectional view along with XXV-XXV of FIG. 21.

FIG. 22 is a cross-sectional view along with XXII-XXII of FIG. 21, FIG. 23 is a cross-sectional view along with XXIII-XXIII of FIG. 21, FIG. 24 is a cross-sectional view along with XXIV-XXIV of FIG. 21 and FIG. 25 is a cross-sectional view along with XXV-XXV of FIG. 21.

The fifth embodiment relates to the layout of nonvolatile SRAM cells.

The layout corresponds to the first embodiment (FIG. 13). In FIGS. 22 to 25, the same elements as those of the first embodiment (FIG. 13) are denoted by the same symbols.

The SRAM cell has a layout of point symmetry as in the conventional SRAM cell.

Specifically, first and second magnetoresistive elements MTJ1, MTJ2 are arranged in a point symmetrical relation in the SRAM cell. Further, first and second magnetoresistive elements MTJ1, MTJ2 are each formed to have magnetic free layer 12, tunnel barrier layer 13 and magnetic pinned layer 11 arranged in this order from the side of a semiconductor substrate 20.

Setting the formation orders of magnetic pinned layers 11, tunnel barrier layers 13 and magnetic free layers 12 of first and second magnetoresistive elements MTJ1, MTJ2 to the same order is extremely effective in simplifying the manufacturing process and reducing the manufacturing cost.

The second and fourth embodiments are different from the first embodiment in that the positions of magnetic pinned layers 11 and magnetic free layers 12 are reversed.

Therefore, the layout corresponding to the second and fourth embodiments can be formed by exchanging magnetic pinned layers 11 and magnetic free layers 12 of first and second magnetoresistive elements MTJ1, MTJ2 in the layout of FIGS. 21 to 25.

3. Application Example

A nonvolatile SRAM cell in the present disclosure can of course be applied to a nonvolatile SRAM and can be additionally applied to a field programmable gate array (FPGA) or the like.

Application examples of the nonvolatile SRAM cell according to the present disclosure are sequentially explained in the following description.

(1) Nonvolatile SRAM

FIG. 26 shows the basic configuration of a nonvolatile SRAM.

Nonvolatile SRAM cells MC are arranged in an array form as in the conventional SRAM to configure memory cell array 21.

Row decoder 22 is arranged at one end of memory cell array 21 in a first direction. Row decoder 22 selects one of word lines (rows) WL.

Sense amplifier 23 and input/output circuit 24 are arranged at the other end of memory cell array 21 in a second direction. Column decoder 25 selects one of bit line pairs (columns) BL, bBL.

(2) FPGA

Figure 27:
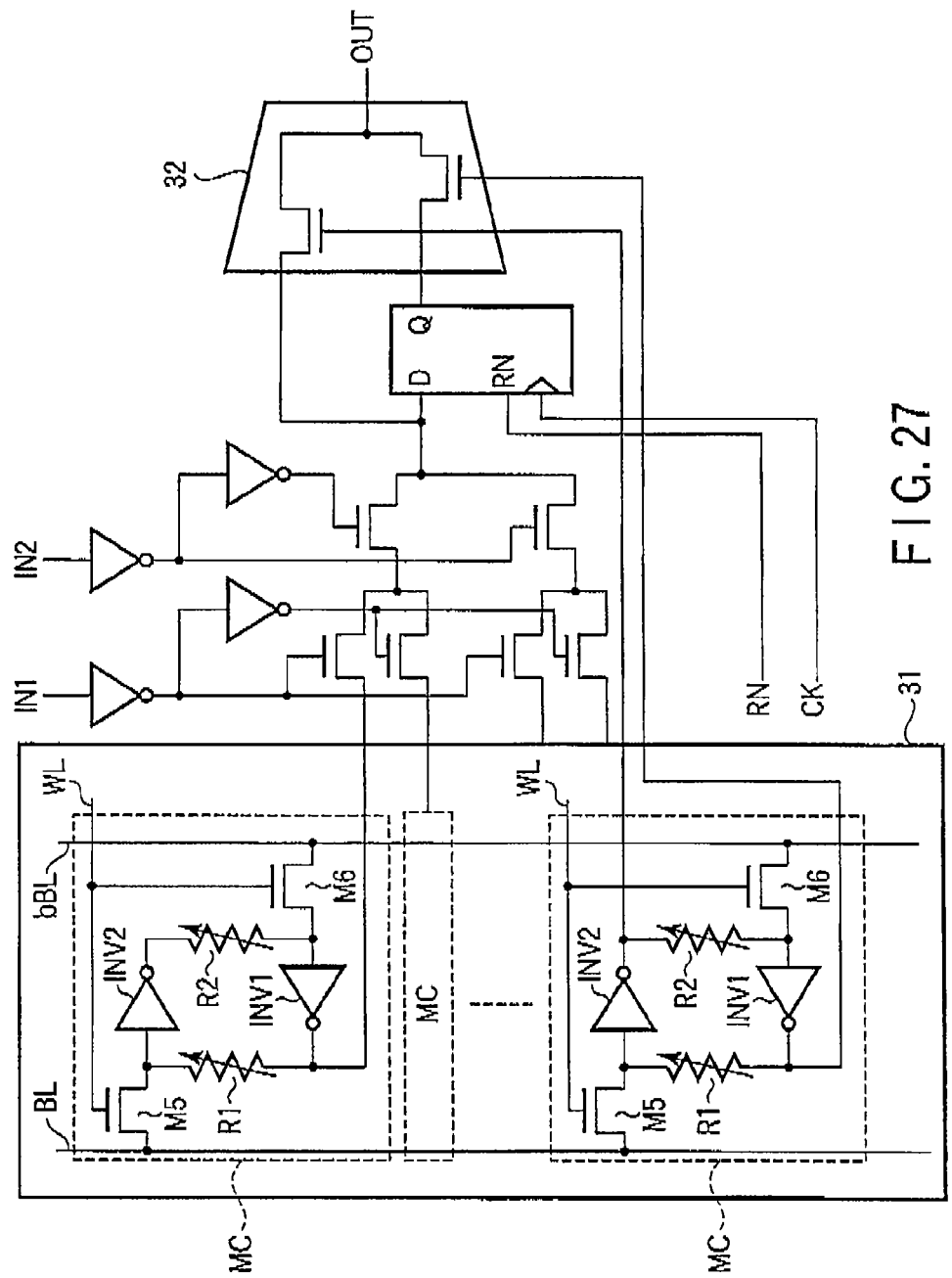
FIGS. 27 and 28 show FPGAs as an application example.

FIG. 27 shows a first example of the FPGA. Nonvolatile SRAM cells MC are arranged in an array form as in the conventional FPGA to configure memory cell array 31.

In the first example, nonvolatile data stored in nonvolatile SRAM cell MC is used as switching data of a multiplexer 32 and a configuration memory of a look up table (LUT) of the FPGA.

Figure 28:
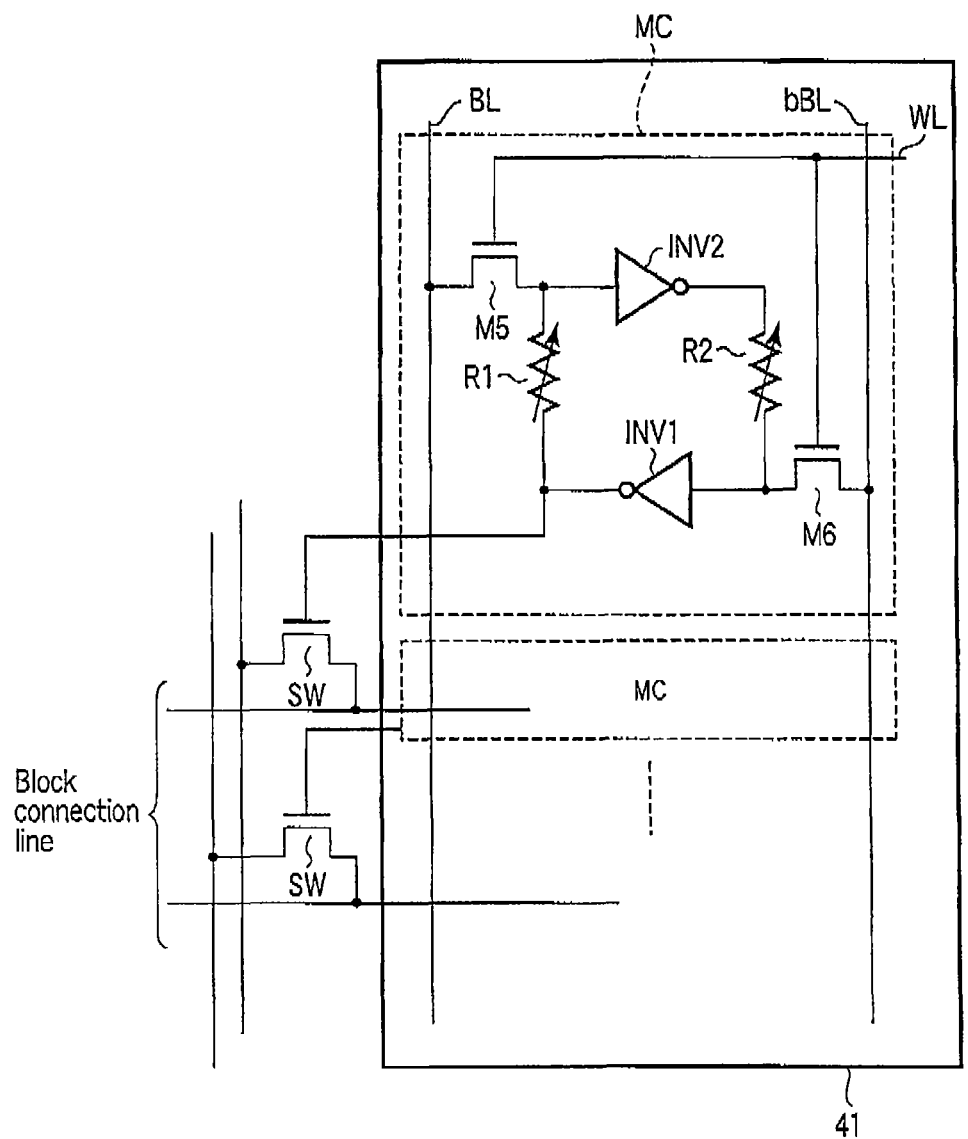

FIG. 28 shows a second example of the FPGA.

Nonvolatile SRAM cells MC are arranged in an array form as in the conventional FPGA to configure memory cell array 41.

In the second example, nonvolatile data stored in nonvolatile SRAM cell MC is used as data that controls transistors SW of a switch block of the FPGA.

4. Conclusion

According to the present invention, a nonvolatile SRAM cell having substantially the same cell area as the cell area of a conventional volatile SRAM cell is realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   first and second inverters;
   a first transistor which has a gate connected to a word line, a source connected to a first bit line, and a drain connected to an input terminal of the second inverter;
   a second transistor which has a gate connected to the word line, a source connected to a second bit line, and a drain connected to an input terminal of the first inverter;
   a first variable resistive element which has a first terminal connected to the drain of the first transistor, and a second terminal connected to an output terminal of the first inverter; and
   a second variable resistive element which has a first terminal connected to the drain of the second transistor, and a second terminal connected to an output terminal of the second inverter.

2. The circuit of claim 1,
   wherein each of the first and second variable resistive elements is a magnetoresistive element.

3. The circuit of claim 1,
   wherein each of the first and second variable resistive elements is a perpendicular magnetic tunnel junction having a magnetic pinned layer, a magnetic free layer, and a tunnel barrier layer therebetween,
   the magnetic pinned layer of the first variable resistive element is connected to the output terminal of the first inverter, and
   the magnetic pinned layer of the second variable resistive element is connected to the output terminal of the second inverter.

4. The circuit of claim 1,
wherein each of the first and second variable resistive elements is a perpendicular magnetic tunnel junction having a magnetic pinned layer, a magnetic free layer, and a tunnel barrier layer therebetween,
the magnetic pinned layer of the first variable resistive element is connected to the drain of the first transistor, and
the magnetic pinned layer of the second variable resistive element is connected to the drain of the second transistor.

5. The circuit of claim 1,
wherein each of the first and second variable resistive elements is a perpendicular magnetic tunnel junction having a magnetic pinned layer, a magnetic free layer, and a tunnel barrier layer therebetween, and
each of the magnetic pinned layers of the first and second variable resistive elements has a SAF structure.

6. The circuit of claim 1, further comprising a control circuit which controls potentials of the word line, the first bit line, and the second bit line,
wherein the control circuit set resistance values of the first and second variable resistive elements to the same by setting potentials of the first and second bit lines to the same, and by turning the first and second transistors on.

7. The circuit of claim 6,
wherein the control circuit executes a data writing by setting the output terminal of the first inverter to a first potential, and by setting the output terminal of the second inverter to a second potential, in a normal mode, and
the control circuit changes a resistance value of one of the first and second variable resistive elements and writes data corresponding to the data writing in the normal mode to the first and second variable resistive elements, by setting potentials of the first and second bit lines to the same, and by turning the first and second transistors on, in a nonvolatile mode after the normal mode.

8. The circuit of claim 7,
wherein the control circuit writes the data to the first and second variable resistive elements by flowing a write current to one of the first and second variable resistive elements in the nonvolatile mode.

9. The circuit of claim 7,
wherein the control circuit writes the data to the first and second variable resistive elements by a write current flowing to the first variable resistive element being greater than a write current flowing to the second variable resistive element in the nonvolatile mode.

10. The circuit of claim 8,
wherein the control circuit recalls the data stored in the first and second variable resistive elements by setting potentials of the first and second bit lines to the same, and by turning the first and second transistors on temporarily, when a power supply to the first and second inverters are restarted after the nonvolatile mode.

11. The circuit of claim 9,
wherein the control circuit recalls the data stored in the first and second variable resistive elements by setting potentials of the first and second bit lines to the same, and by turning the first and second transistors on temporarily, when a power supply to the first and second inverters are restarted after the nonvolatile mode.

12. A semiconductor integrated circuit comprising:
first and second inverters;
a first transistor which has a gate connected to a word line, a source connected to a first bit line, and a drain connected to an input terminal of the second inverter;
a second transistor which has a gate connected to the word line, a source connected to a second bit line, and a drain connected to an input terminal of the first inverter;
a first variable resistive element which has a first terminal connected to the drain of the first transistor, and a second terminal connected to an output terminal of the first inverter; and
a second variable resistive element which has a first terminal connected to the drain of the second transistor, and a second terminal connected to an output terminal of the second inverter,
wherein each of the first and second variable resistive elements is a perpendicular magnetic tunnel junction having a magnetic pinned layer, a magnetic free layer, and a tunnel barrier layer therebetween,
the magnetic pinned layer of the first variable resistive element is connected to the output terminal of the first inverter, and
the magnetic pinned layer of the second variable resistive element is connected to the output terminal of the second inverter.

13. The circuit of claim 12,
wherein each of the magnetic pinned layers of the first and second variable resistive elements has a SAF structure.

14. The circuit of claim 12, further comprising a control circuit which controls potentials of the word line, the first bit line, and the second bit line,
wherein the control circuit set resistance values of the first and second variable resistive elements to the same by setting potentials of the first and second bit lines to the same, and by turning the first and second transistors on.

15. The circuit of claim 14,
wherein the control circuit executes a data writing by setting the output terminal of the first inverter to a first potential, and by setting the output terminal of the second inverter to a second potential, in a normal mode, and
the control circuit changes a resistance value of one of the first and second variable resistive elements and writes data corresponding to the data writing in the normal mode to the first and second variable resistive elements, by setting potentials of the first and second bit lines to the same, and by turning the first and second transistors on, in a nonvolatile mode after the normal mode.

16. A semiconductor integrated circuit comprising:
first and second inverters;
a first transistor which has a gate connected to a word line, a source connected to a first bit line, and a drain connected to an input terminal of the second inverter;
a second transistor which has a gate connected to the word line, a source connected to a second bit line, and a drain connected to an input terminal of the first inverter;
a first variable resistive element which has a first terminal connected to the drain of the first transistor, and a second terminal connected to an output terminal of the first inverter; and
a second variable resistive element which has a first terminal connected to the drain of the second transistor, and a second terminal connected to an output terminal of the second inverter,
wherein each of the first and second variable resistive elements is a perpendicular magnetic tunnel junction having a magnetic pinned layer, a magnetic free layer, and a tunnel barrier layer therebetween, the magnetic pinned layer of the first variable resistive element is connected to the drain of the first transistor, and the magnetic pinned layer of the second variable resistive element is connected to the drain of the second transistor.

17. The circuit of claim 16,
wherein each of the magnetic pinned layers of the first and second variable resistive elements has a SAF structure.

18. The circuit of claim 16, further comprising a control circuit which controls potentials of the word line, the first bit line, and the second bit line,
wherein the control circuit set resistance values of the first and second variable resistive elements to the same by setting potentials of the first and second bit lines to the same, and by turning the first and second transistors on.

19. The circuit of claim 18,
wherein the control circuit executes a data writing by setting the output terminal of the first inverter to a first potential, and by setting the output terminal of the second inverter to a second potential, in a normal mode, and
the control circuit changes a resistance value of one of the first and second variable resistive elements and writes data corresponding to the data writing in the normal mode to the first and second variable resistive elements, by setting potentials of the first and second bit lines to the same, and by turning the first and second transistors on, in a nonvolatile mode after the normal mode.

* * * * *